(12) United States Patent
Kamibayashi

(10) Patent No.: US 10,749,363 B2
(45) Date of Patent: Aug. 18, 2020

(54) SEMICONDUCTOR DEVICE, BATTERY SYSTEM, AND BATTERY CONTROL METHOD

(71) Applicant: Renesas Electronics Corporation, Tokyo (JP)

(72) Inventor: Toshiya Kamibayashi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 101 days.

(21) Appl. No.: 16/048,399

(22) Filed: Jul. 30, 2018

(65) Prior Publication Data
US 2019/0089179 A1  Mar. 21, 2019

(30) Foreign Application Priority Data

Sep. 21, 2017 (JP) ................. 2017-181610

(51) Int. Cl.
| | | |
|---|---|---|
| *H02J 7/00* | (2006.01) | |
| *H02M 3/07* | (2006.01) | |
| *H01M 10/44* | (2006.01) | |
| *H01M 10/48* | (2006.01) | |
| *H01M 10/42* | (2006.01) | |
| *G01R 31/396* | (2019.01) | |
| *G01R 31/3835* | (2019.01) | |

(52) U.S. Cl.
CPC ........ *H02J 7/0063* (2013.01); *G01R 31/3835* (2019.01); *G01R 31/396* (2019.01); *H01M 10/425* (2013.01); *H01M 10/441* (2013.01); *H01M 10/482* (2013.01); *H02J 7/0019* (2013.01); *H02M 3/07* (2013.01); *H01M 2010/4271* (2013.01); *H02J 2007/0067* (2013.01)

(58) Field of Classification Search
CPC .... H02J 7/0063; H02J 7/0019; H01M 10/441; H01M 10/482; G01R 31/396; G01R 31/3835
USPC ........ 320/119, 120, 121, 122, 134, 136, 163
See application file for complete search history.

(56) References Cited

U.S. PATENT DOCUMENTS 9,413,037 B2  8/2016  Shimamura et al.
2009/0160401 A1  6/2009  Dishman et al.
(Continued)

FOREIGN PATENT DOCUMENTS

WO  2011/102241 A1  8/2011

OTHER PUBLICATIONS

Extended European Search Report received in corresponding European Application No. 18187813.3 dated Oct. 22, 2018.

*Primary Examiner* — Edward Tso
*Assistant Examiner* — Aaron Piggush
(74) *Attorney, Agent, or Firm* — Mattingly & Malur, PC

(57) ABSTRACT

Provided are a semiconductor device, a battery system, and a battery control method that are capable of reducing difference in remaining capacity without regard to the load status of a battery pack. The semiconductor device includes a high-voltage resistant circuit and a low-voltage circuit. The high-voltage resistant circuit includes a multiplexer that selects one of multiple series-coupled battery cells in a battery pack and couples the selected battery cell to the battery pack. The low-voltage circuit includes a measurement circuit that individually measures voltages of the battery cells. The multiplexer couples one of the battery cells to a power supply for the low-voltage circuit.

13 Claims, 27 Drawing Sheets

(56) References Cited

U.S. PATENT DOCUMENTS

| | | |
|---|---|---|
| 2010/0277123 A1 | 11/2010 | Lim et al. |
| 2012/0001683 A1 | 1/2012 | Wang |
| 2012/0306449 A1* | 12/2012 | Tagami ................ H02J 7/0024 |
| | | 320/118 |
| 2013/0258830 A1* | 10/2013 | Yoda .................... H02J 7/0068 |
| | | 369/53.42 |
| 2015/0058654 A1 | 2/2015 | Ukai et al. |
| 2015/0288199 A1 | 10/2015 | Bui-Van et al. |

* cited by examiner

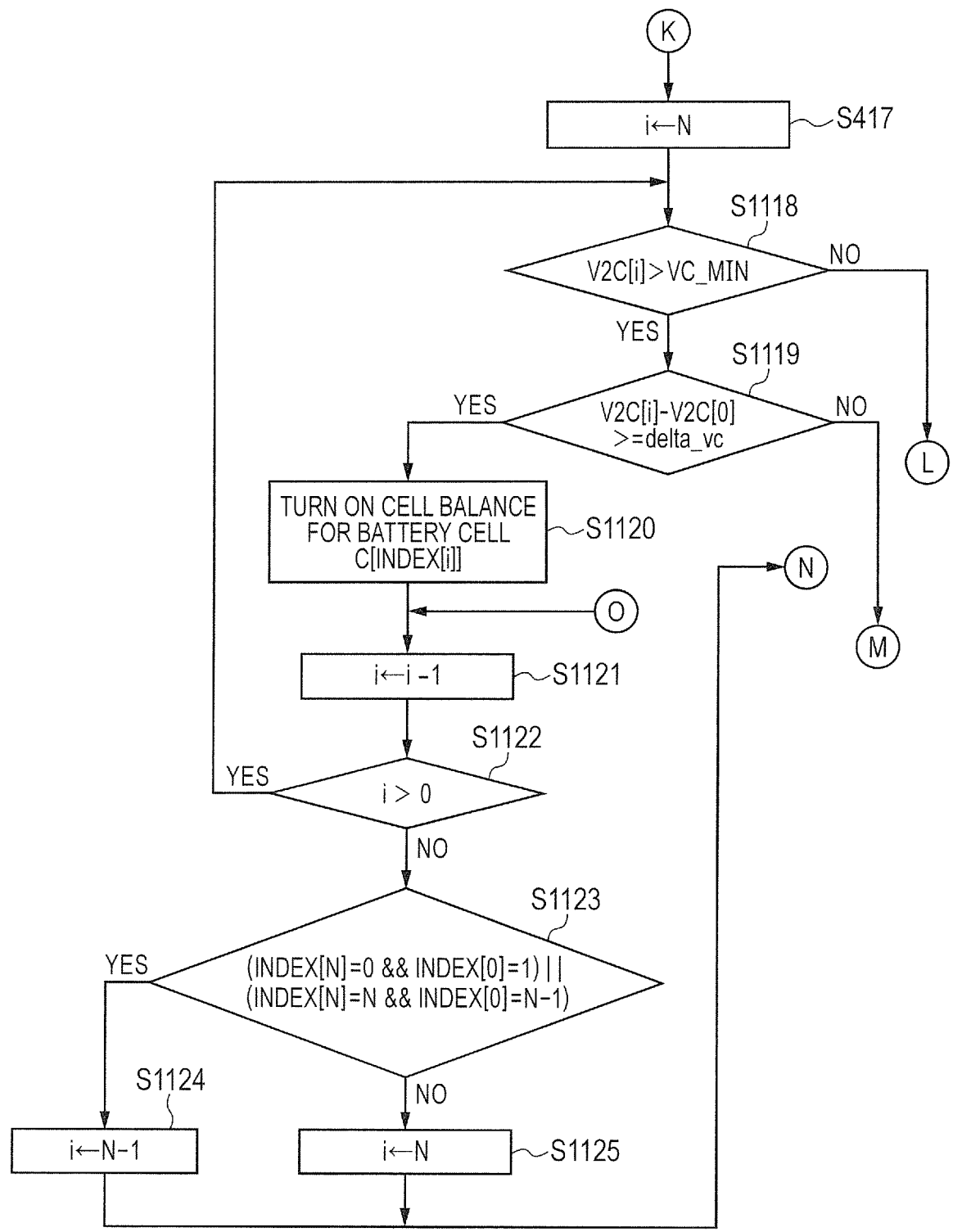

SEMICONDUCTOR DEVICE, BATTERY SYSTEM, AND BATTERY CONTROL METHOD

CROSS-REFERENCE TO RELATED APPLICATIONS

The disclosure of Japanese Patent Application No. 2017-181610 filed on Sep. 21, 2017 including the specification, drawings, and abstract is incorporated herein by reference in its entirety.

BACKGROUND

The present invention relates to a semiconductor device, a battery system, and a battery control method. More particularly, the present invention relates to a semiconductor device, a battery system, and a battery control method that are used, for example, for a battery monitoring circuit.

A well-known technology for a battery pack formed of multiple cells equalizes the capacities of the cells by making capacity adjustments in accordance with capacity difference between the cells in order to prevent overdischarging and overcharging from being caused by different remaining capacities of the cells.

A technology described in International Publication WO 2011/102241 selects, from multiple cells, one or more cells having a voltage value equal to or higher than a cell capacity adjustment target voltage, and uses the selected cells to intermittently operate an intermittently operative unit that operates even while electrically powered equipment is at rest. Further, the technology described in International Publication WO 2011/102241 repeats this intermittent operation to decrease the voltage values of the selected cells, thereby reducing difference in remaining capacity between the cells without wastefully discharging battery energy stored in a battery pack.

SUMMARY

However, an operation performed by a cell capacity adjustment device described in International Publication WO 2011/102241 in order to reduce the difference in remaining capacity is limited while the operation is paused. Therefore, the difference in remaining capacity between the cells cannot be reduced during a certain period while the electrically powered equipment is operating. The present invention provides a technology for reducing the difference in remaining capacity without regard to the load status of a battery pack.

Other problems and novel features will become apparent from the following description and from the accompanying drawings.

According to an embodiment of the present invention, there is provided a semiconductor device including a high-voltage resistant circuit and a low-voltage circuit. The high-voltage resistant circuit includes a multiplexer. The multiplexer selects one of multiple series-coupled battery cells in a battery pack and couples the selected battery cell to the battery pack. The low-voltage circuit includes a measurement circuit that individually measures the voltages of the battery cells. The multiplexer couples one of the battery cells to a power supply for the low-voltage circuit.

The embodiment of the present invention reduces the difference in remaining capacity without regard to the load status of a battery pack.

BRIEF DESCRIPTION OF THE DRAWINGS

FIG. 12B is a flowchart illustrating an exemplary operation of the semiconductor device according to the second embodiment;

DETAILED DESCRIPTION

Figure 1:
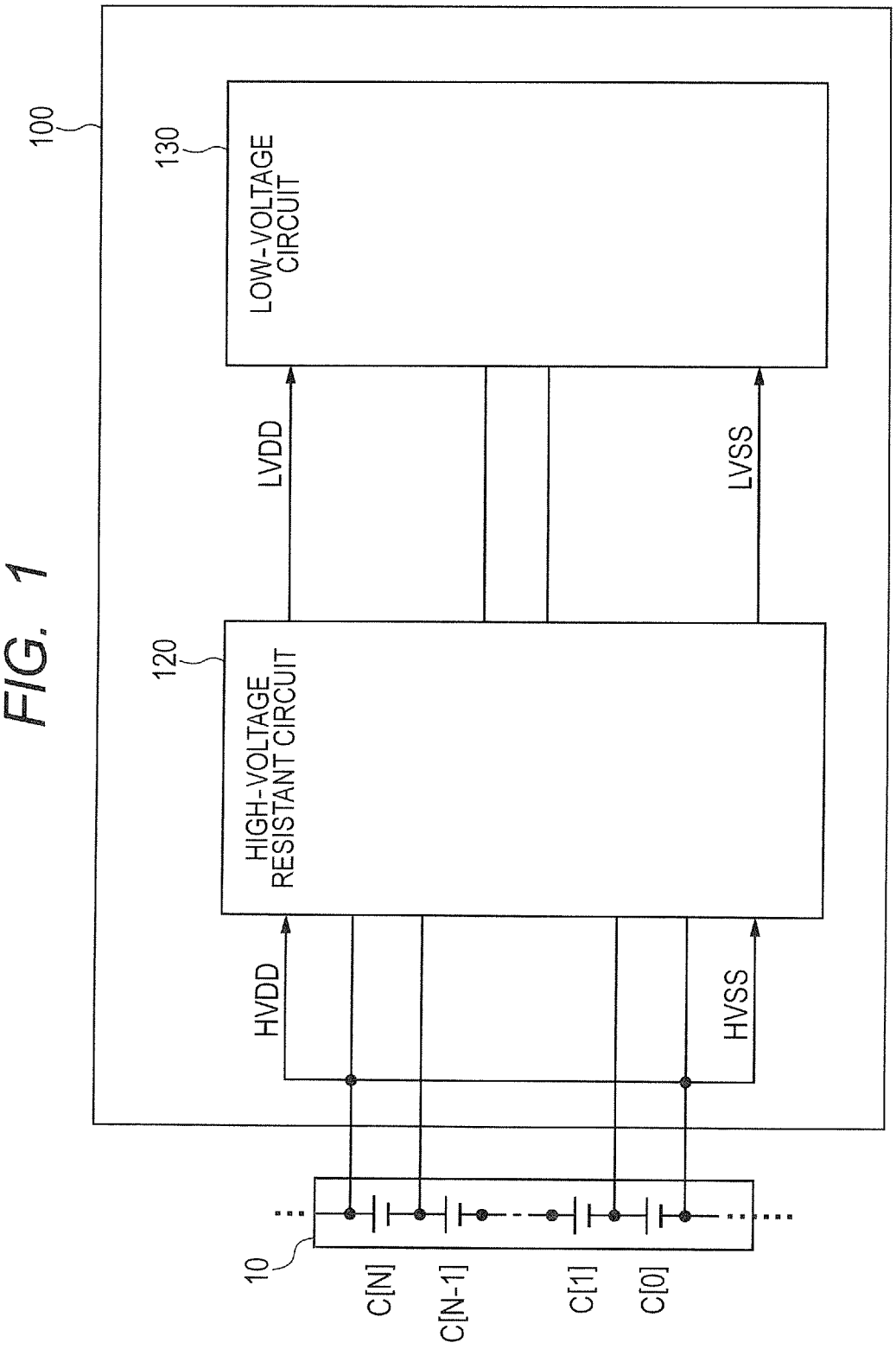
FIG. 1 is a block diagram illustrating a configuration of a semiconductor device according to an overview of embodiments of the present invention.

In the following description and in the drawings, omissions and simplifications are made as needed for the clarification of explanation. Further, hardware for various elements depicted in the drawings as functional blocks performing various processes can be implemented by a CPU, a memory, or other circuit while software for such elements is implemented, for instance, by a program loaded into the memory. Therefore, it is to be understood by those skilled in the art that the functional blocks can be variously implemented by hardware only, by software only, or by a combination of hardware and software, and are not implemented restrictively by hardware alone or by software alone. Furthermore, like elements in the drawings are designated by like reference numerals and will not be redundantly described.

Overview of Embodiments

FIG. 1 is a block diagram illustrating a configuration of a semiconductor device according to an overview of embodiments of the present invention. Referring to FIG. 1, the semiconductor device 100 includes a high-voltage resistant circuit 120 and a low-voltage circuit 130.

The high-voltage resistant circuit includes a multiplexer. The multiplexer selects and couples, to a battery pack 10, one of series-coupled multiple battery cells in the battery pack 10.

The low-voltage circuit 130 includes a measurement circuit that individually measures the voltages of the battery cells.

The multiplexer in the high-voltage resistant circuit couples one of the battery cells, except for a battery cell having the lowest measured voltage, to a power supply for the low-voltage circuit 130.

As described above, the semiconductor device according to the overview of embodiments of the present invention is capable of providing increased energy efficiency because it supplies a remaining capacity to the low-voltage circuit to equalize the capacities of the battery cells.

First Embodiment

Figure 2:
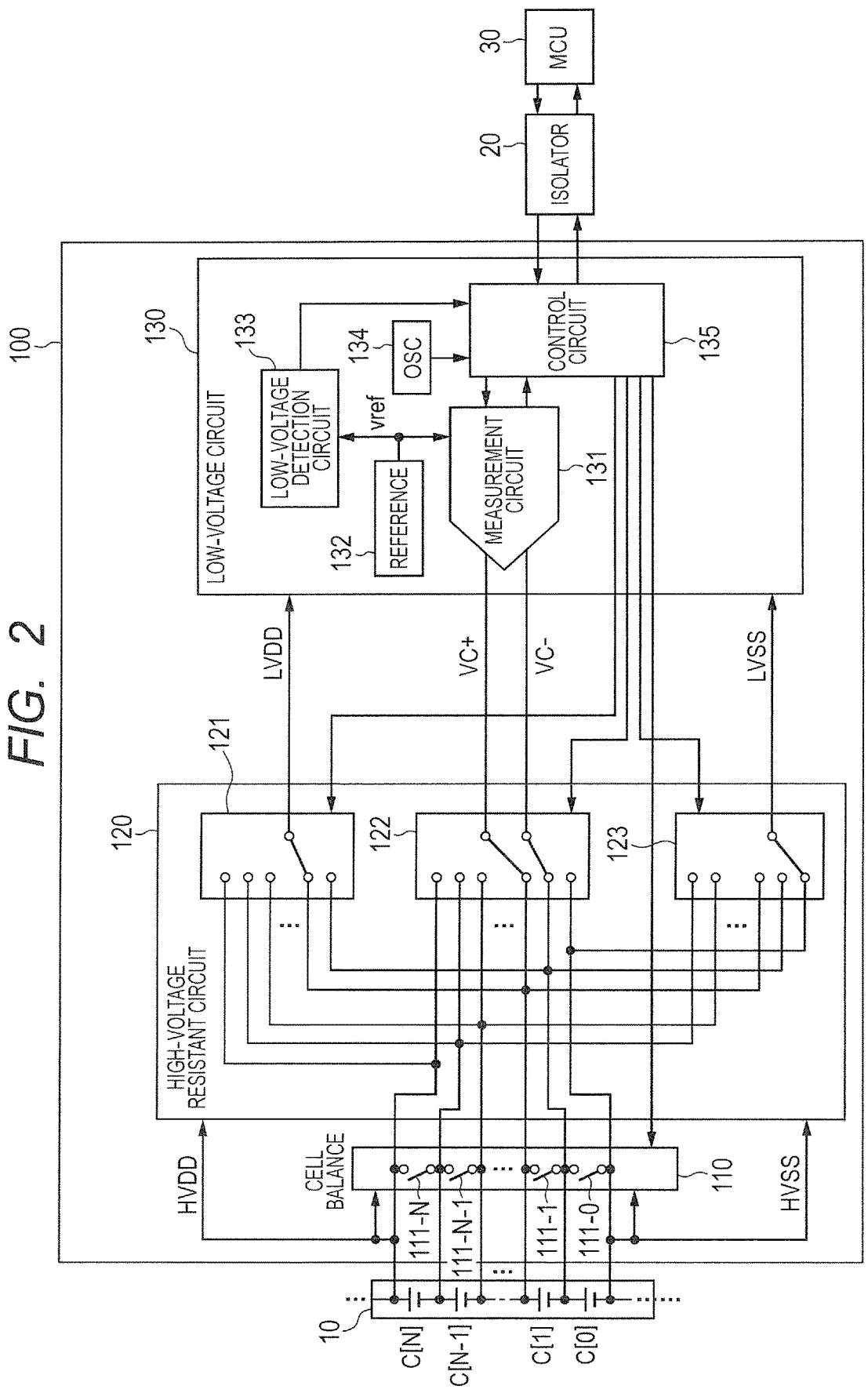
FIG. 2 is a circuit diagram illustrating an example of the semiconductor device according to a first embodiment of the present invention.

FIG. 2 is a circuit diagram illustrating an example of the semiconductor device according to a first embodiment of the present invention. Referring to FIG. 2, the semiconductor device 100 includes a cell balance 110, the high-voltage resistant circuit 120, and the low-voltage circuit 130. The semiconductor device 100 is coupled to an isolator 20 to communicate with an MCU 30 and function as a battery monitoring circuit for monitoring the voltage of the battery pack 10.

The cell balance 110 includes N+1 switches 111-0 to 111-N. N is a positive integer. The high-voltage resistant circuit 120 includes a VDD multiplexer 121, a VC multiplexer 122, and a VSS multiplexer 123. The VDD multiplexer 121 selects a power supply for the low-voltage circuit. The VC multiplexer 122 selects a battery cell whose battery voltage is to be measured. The VSS multiplexer 123 selects a reference voltage for the low-voltage circuit. The low-voltage circuit 130 includes a measurement circuit 131, a reference 132, a low-voltage detection circuit 133, an OSC 134, and a control circuit 135.

The battery pack 10 is configured so that N+1 cells C[0]-C[N] are series-coupled. The battery cells C[0]-C[N] are rechargeable batteries. The battery cells C[0]-C[N] are, for example, lithium-ion batteries or other similar batteries whose remaining capacities have a fixed proportional relation to an open-circuit voltage.

The battery pack 10 is coupled to the cell balance 110 and the high-voltage resistant circuit 120 as a power supply that outputs an HVDD (high drive voltage) and an HVSS (high reference voltage).

The switches 111-0 to 111-N are parallel-coupled to the battery cells C[0]-C[N]. The control circuit 135 controls the opening and closing of the switches 111-0 to 111-N. The switches 111-0 to 111-N form a passive cell balance circuit (cell balance 110) that balances the capacities of the battery cells C[0]-C[N] by using a switch and a protective resistor to short-circuit between positive and negative electrodes of the battery cells C[0]-C[N].

The positive electrodes of the battery cells C[0]-C[N] are coupled to a selection terminal of the VDD multiplexer 121. Similarly, opposing ends of the battery cells C[0]-C[N] are coupled to the VC multiplexer 122. The negative electrodes of the battery cells C[0]-C[N] are coupled to a selection terminal of the VSS multiplexer 123.

The isolator 20 is a signal isolator capable of providing direct-current insulation between input signals and output signals. The isolator 20 is coupled to the semiconductor 100 and the MCU 30 in order to avert or suppress a wraparound electric current signal and wraparound noise when signals are exchanged between the semiconductor device 100 and the MCU 30.

The MCU (microcontroller unit) 30 is an integrated circuit optimized for electronic equipment control. In the first embodiment, the semiconductor 100 may be partly controlled by the MCU 30. An example in which the MCU 30 controls the semiconductor device 100 will be described later.

A common terminal of the VDD multiplexer 121 and a common terminal of the VSS multiplexer 123 are coupled to the low-voltage circuit 130 as a power supply. Two common terminals of the VC multiplexer 122 are respectively coupled to two measurement terminals of the measurement circuit 131.

The VDD multiplexer 121 is a selector switch for selectively coupling one of the battery cells C[0]-C[N] to the power supply for the low-voltage circuit 130. The VDD multiplexer 121 is configured so that its selection terminal is coupled to the battery cells C[0]-C[N] while its common terminal is coupled to the power supply for the low-voltage circuit 130. The coupling of the VDD multiplexer 121 can be changed in accordance with an instruction from the control circuit 135.

The VC multiplexer 122 is a switch having N+1 selection terminals and two common terminals. The VC multiplexer 122 may be, for example, a switch that couples the two common terminals to neighboring selection terminals. The VC multiplexer 122 is configured so that its selection terminals are coupled to the battery cells C[0]-C[N] while its common terminals are coupled to the measurement circuit 131. The VC multiplexer 122 is a switch that selectively couples the opposing ends of one of the battery cells C[0]-C[N]. The coupling of the VC multiplexer 122 can be changed in accordance with an instruction from the control circuit 135.

The VSS multiplexer 123 is a selector switch for selectively coupling one of the battery cells C[0]-C[N] to a GND of the low-voltage circuit 130. The VSS multiplexer 123 is configured so that its selection terminal is coupled to the battery cells C[0]-C[N] while its common terminal is coupled to the GND of the low-voltage circuit 130. The coupling of the VSS multiplexer 123 can be changed in accordance with an instruction from the control circuit 135.

The measurement circuit 131 measures the voltages of the battery cells C[0]-C[N] through the VC multiplexer 122. The measurement circuit 131 outputs the results of measurements to the control circuit 135.

The reference 132 is a circuit that outputs a reference voltage to the measurement circuit 131 and the low-voltage detection circuit 133.

The low-voltage detection circuit 133 compares the power supply-GND voltage of the low-voltage circuit 130 with a minimum power supply voltage level and outputs the result of comparison to the control circuit 135. The minimum power supply voltage level is a lowest power supply voltage level at which the operation of the low-voltage circuit is guaranteed.

The OSC 134 is an oscillation circuit that generates a clock signal having a predetermined frequency and outputs the clock signal to the control circuit 135. For example, an RC oscillation circuit, a crystal oscillator circuit, or a phase-locked loop (PLL) frequency synthesizer circuit is suitable as the OSC 134.

The control circuit 135 is a controller for controlling the operations of the elements in the low-voltage circuit 130. The configuration and operation of the control circuit 135 will be described in detail later.

Figure 3:
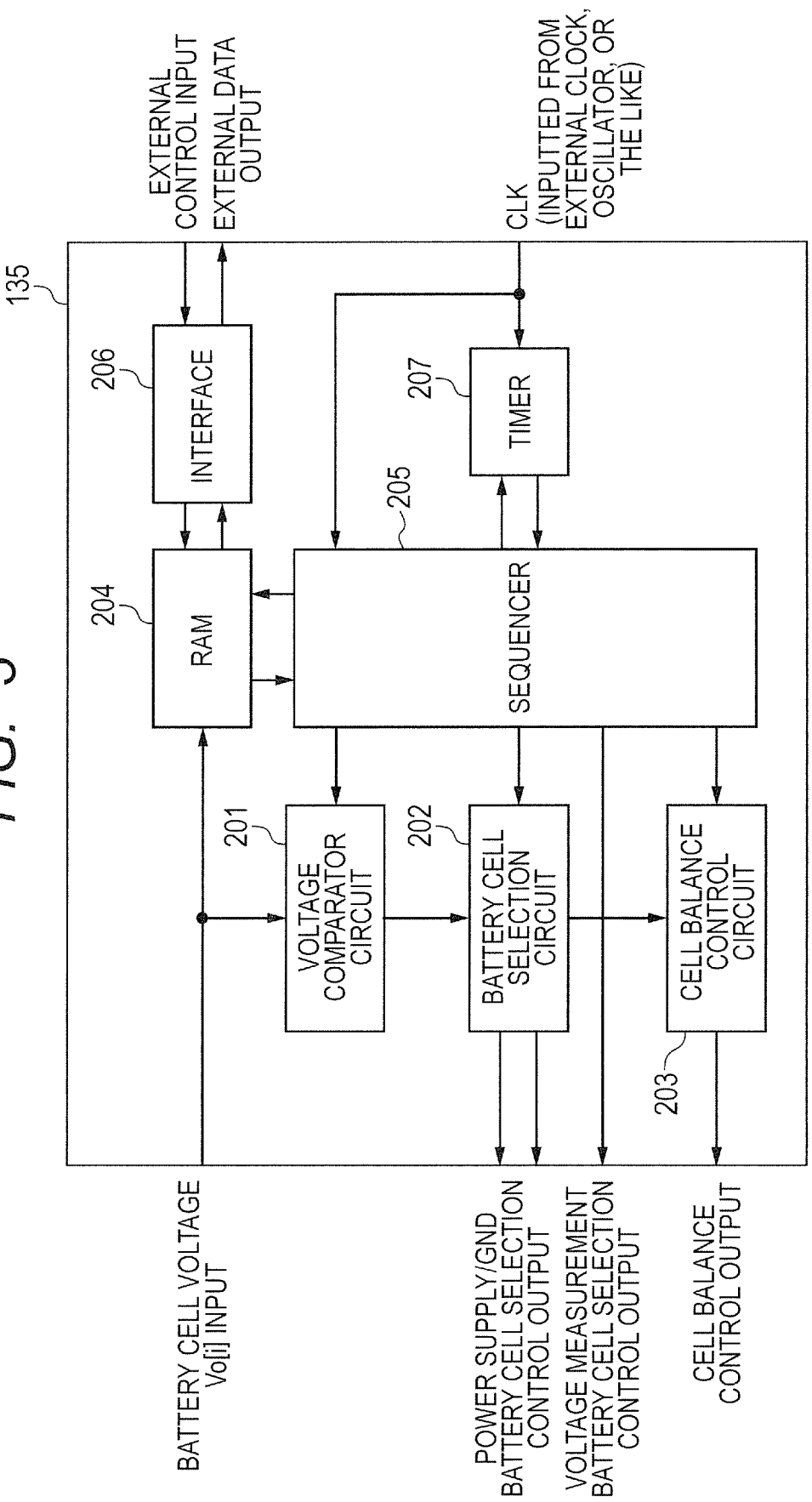
FIG. 3 is a block diagram illustrating an example of a control circuit of the semiconductor device according to the first embodiment.

A detailed configuration of the control circuit 135 for a case where the control circuit 135 controls a battery monitoring operation will now be described. FIG. 3 is a block diagram illustrating an example of the control circuit of the semiconductor device according to the first embodiment. Referring to FIG. 3, the control circuit 135 includes a voltage comparator circuit 201, a battery cell selection circuit 202, a cell balance control circuit 203, a RAM 204, a sequencer 205, an interface 206, and a timer 207.

The voltage comparator circuit 201 compares a voltage value stored in the RAM 204 with a predetermined voltage, and outputs the result of comparison to the battery cell selection circuit 202.

The battery cell selection circuit 202 selects a battery cell C[0]-C[N] to be coupled to the power supply for the low-voltage circuit 130 in accordance with the result of comparison by the voltage comparator circuit 201 and with an instruction from the sequencer 205, and outputs a selection control signal indicative of the selected cell to the VDD multiplexer 121, the VSS multiplexer 123, and the cell balance control circuit 203. Destinations to which the VDD multiplexer 121 and the VSS multiplexer 123 are to be coupled are switched in accordance with the selection control signal.

In accordance with information about the battery cell C[0]-C[N] selected by the battery cell selection circuit 202 and with an instruction from the sequencer 205, the cell balance control circuit 203 outputs a cell balance control signal to the cell balance 110. More specifically, the cell balance control signal outputted from the cell balance control circuit 203 is a signal for designating the opening and closing of the switches 111-0 to 111-N in the cell balance 110 in order to equalize the capacities of the battery cells.

The RAM (random-access memory) 204 is a storage circuit for storing the voltage values of the battery cells C[0]-C[N] that are measured by the measurement circuit 131. The RAM 204 has a storage area for storing the measured voltage values of the battery cells C[0]-C[N] and a storage area for storing sorting results of the measured voltage values of the battery cells C[0]-C[N].

The sequencer 205 specifies the operations of the elements in the control circuit 135 in accordance with a predetermined control sequence. More specifically, the sequencer 205 specifies later-described operations of the control circuit 135.

The interface 206 adjusts the level and timing of a signal in order to communicate with the MCU 30 through the isolator 20.

The timer 207 measures a predetermined time. The timer 207 measures the time designated by the sequencer 205. The timer 207 notifies the sequencer 205 of the lapse of the designated time.

Figure 4:
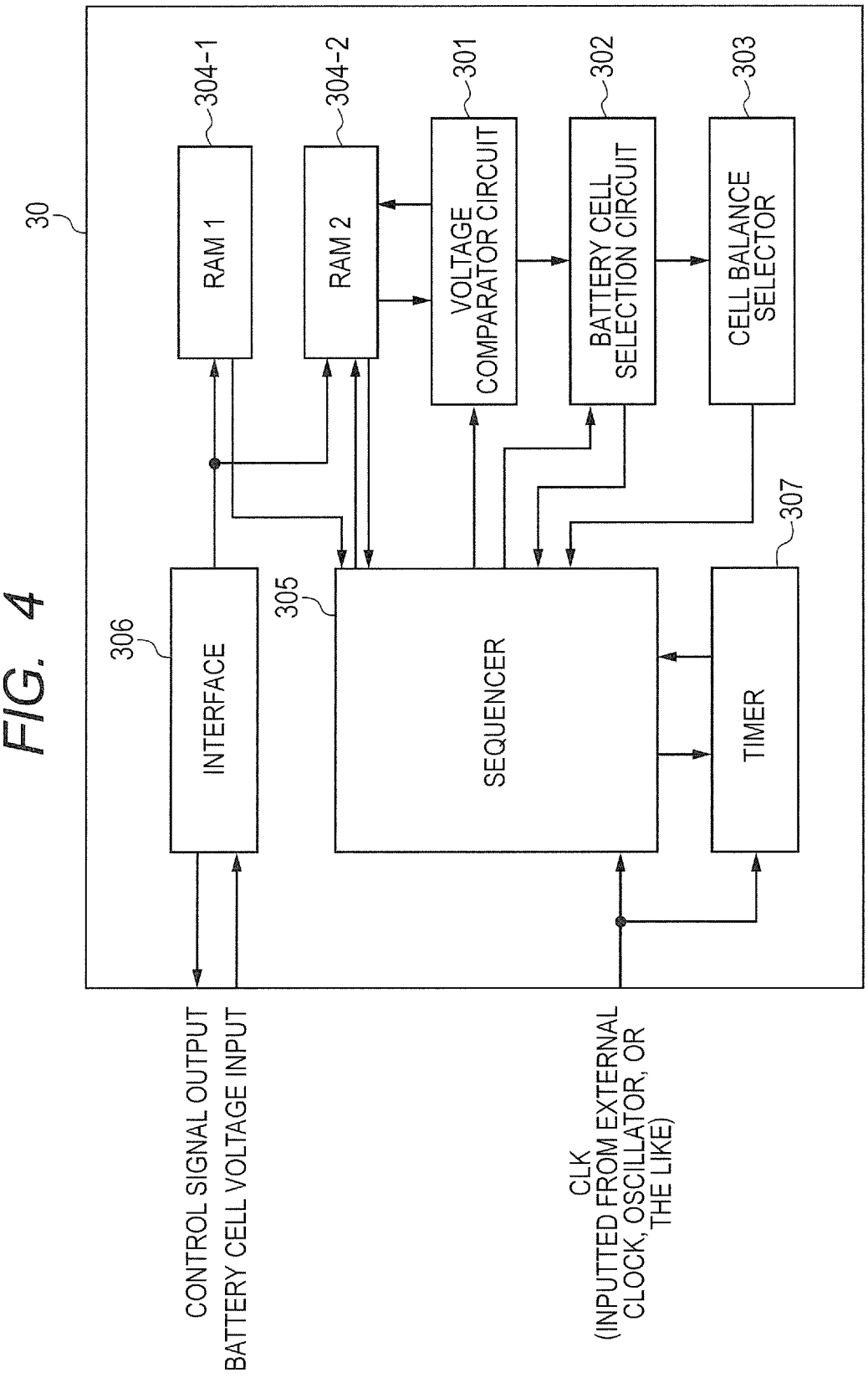
FIG. 4 is a block diagram illustrating an example of an MCU of the semiconductor device according to the first embodiment.

A detailed configuration of the MCU 30 for a case where the MCU 30 controls a battery monitoring operation will now be described. FIG. 4 is a block diagram illustrating an example of the MCU of the semiconductor device according to the first embodiment. Referring to FIG. 4, the MCU 30 includes a voltage comparator circuit 301, a battery cell selection circuit 302, a cell balance control circuit 303, a RAM 304-1, a RAM 304-2, a sequencer 305, an interface 306, and a timer 307.

The voltage comparator circuit 301 compares voltage values stored in the RAM 304-2, and outputs the result of comparison to the battery cell selection circuit 302.

The battery cell selection circuit 302 selects a battery cell C[0]-C[N] to be coupled to the power supply for the low-voltage circuit 130 in accordance with the result of comparison by the voltage comparator circuit 301 and with an instruction from the sequencer 305, and outputs a selection control signal indicative of the selected cell to the control circuit 135 through the interface 306. Destinations to which the VDD multiplexer 121 and the VSS multiplexer 123 are to be coupled are switched in accordance with the selection control signal.

In accordance with information about the battery cell C[0]-C[N] selected by the battery cell selection circuit 302 and with an instruction from the sequencer 305, the cell balance control circuit 303 outputs a cell balance control signal to the cell balance 110. More specifically, the cell balance control signal outputted from the cell balance control circuit 303 is a signal for designating the opening and closing of the switches 111-0 to 111-N in the cell balance 110 in order to equalize the capacities of the battery cells.

The RAM 304-1 is a storage circuit for storing the voltage values of the battery cells C[0]-C[N] that are measured by the measurement circuit 131. The RAM 304-1 has a storage area for storing the measured voltage values of the battery cells C[0]-C[N].

The RAM 304-2 is a storage circuit for storing the voltage values of the battery cells C[0]-C[N] that are measured by the measurement circuit 131. Further, the RAM 304-2 has a storage area for storing sorting results of the measured voltage values of the battery cells C[0]-C[N].

The sequencer 305 specifies the operations of the elements in the MCU 30 in accordance with a predetermined control sequence. More specifically, the sequencer 305 specifies the later-described operations of the control circuit 135 as the operations of the MCU 30.

The interface 306 adjusts the level and timing of a signal in order to communicate with the control circuit 135 through the isolator 20.

The timer 307 measures a predetermined time. The timer 307 measures the time designated by the sequencer 305. The timer 307 notifies the sequencer 305 of the lapse of the designated time.

Figure 5A:
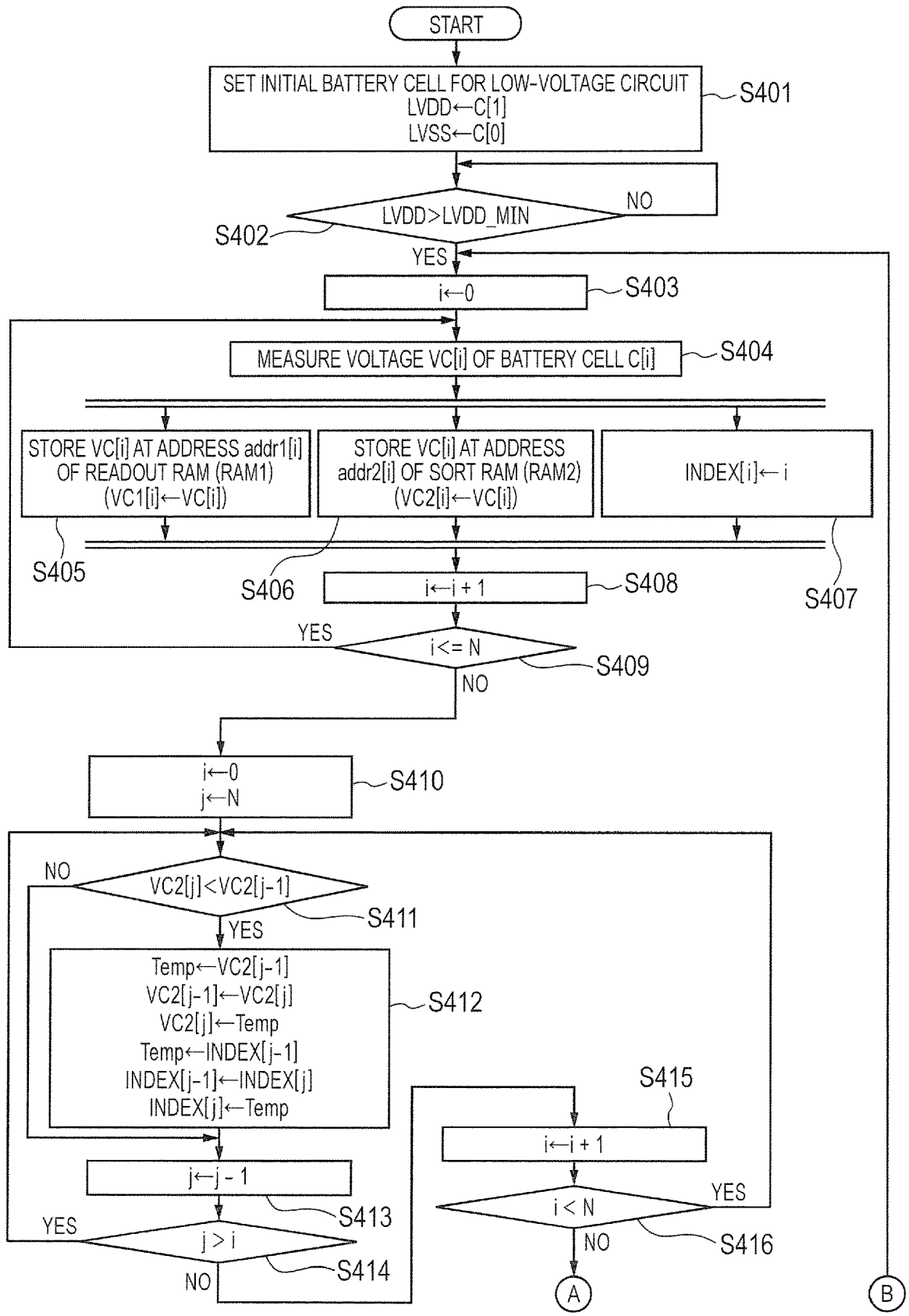
FIG. 5A is a flowchart illustrating an exemplary operation of the semiconductor device according to the first embodiment.
Figure 5B:
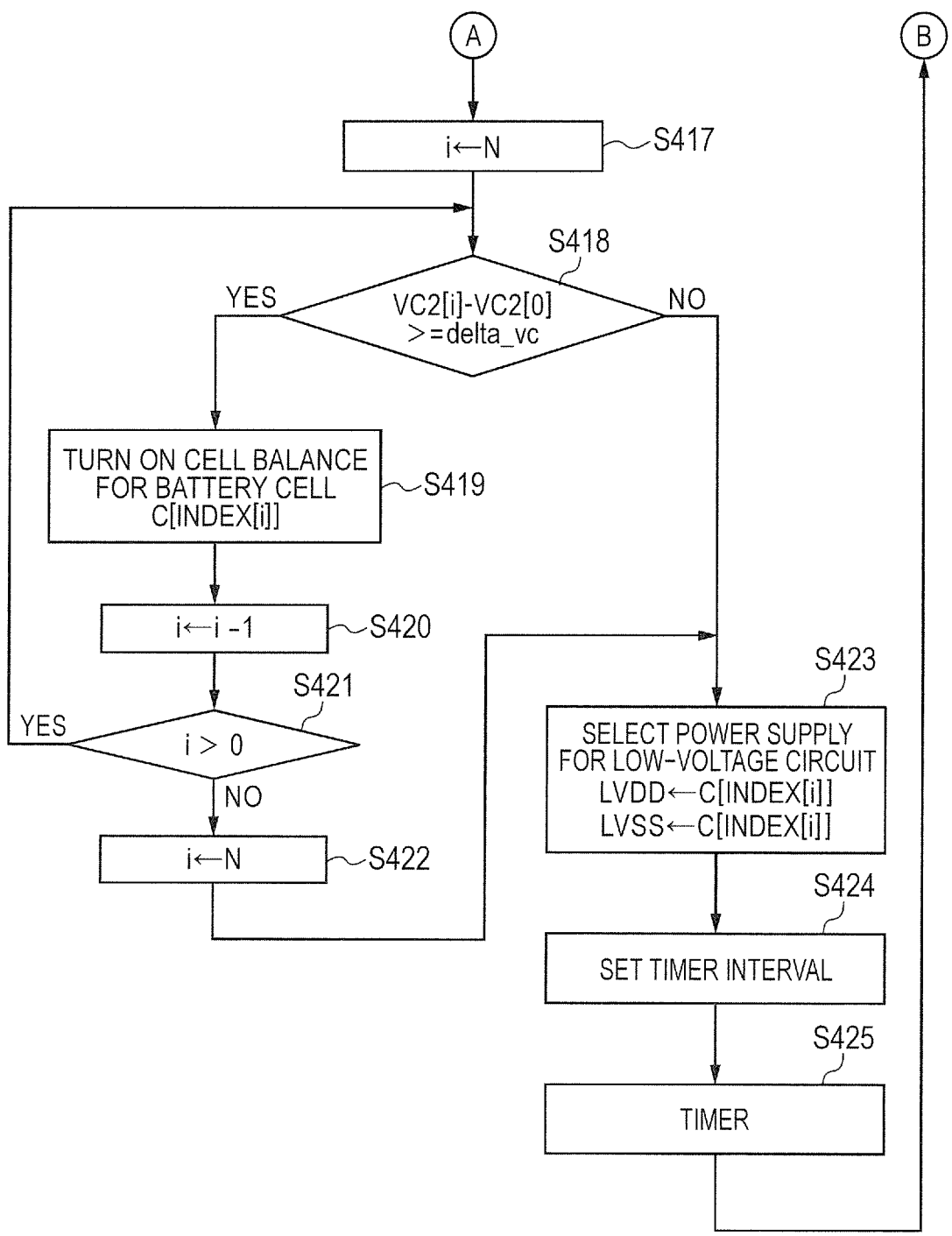
FIG. 5B is a flowchart illustrating an exemplary operation of the semiconductor device according to the first embodiment.

Operations of the semiconductor device 100 will now be described. FIGS. 5A and 5B are flowcharts illustrating exemplary operations of the semiconductor device according to the first embodiment.

First of all, in step S401, the control circuit 135 sets an initial battery cell for the low-voltage circuit. Upon completion of step S401, processing proceeds to step S402. More specifically, the VDD multiplexer 121 and the VSS multiplexer 123 are switched in step S401 so that the cell C[0] is coupled as the power supply for the low-voltage circuit 130.

In step S402, the control circuit 135 determines whether an LVDD (low-voltage circuit drive voltage) is higher than a predetermined threshold value LVDD_MIN. If the LVDD is higher than the threshold value LVDD_MIN, processing proceeds to step S403. If the LVDD is not higher than the threshold value LVDD_MIN, step S402 is repeated.

In step S403, the control circuit 135 sets a cell number i targeted for measurement to 0. Upon completion of step S403, processing proceeds to step S404.

In step S404, the measurement circuit 131 measures the voltage of a battery cell having the cell number i. Upon completion of step S404, processing proceeds to steps S405, S406, and S407. Steps S405, S406, and S407 are performed in parallel.

In step S405, a voltage VC[i] is stored at an address addr1[i] in a readout RAM (RAM 1). Upon completion of storage, processing proceeds to step S408.

In step S406, the voltage VC[i] is stored at an address addr2[i] in a sort RAM (RAM 2) as a sort voltage VC2[i]. Upon completion of storage, processing proceeds to step S408.

In step S407, the control circuit 135 set the cell number i to index[i]. Upon completion of step S407, processing proceeds to step S408.

In step S408, the control circuit 135 increments the cell number i by one. Upon completion of step S408, processing proceeds to step S409.

In step S409, the control circuit 135 determines whether the cell number i is not greater than a maximum cell number N. If the cell number i is not greater than N, processing returns to step S404. If the cell number i is greater than N, processing proceeds to step S410.

In step S410, the control circuit 135 sets the cell number i to 0 and sets a sort cell number j to N. Upon completion of step S410, processing proceeds to step S411.

In step S411, the control circuit 135 determines whether a sort voltage VC2[j] is lower than a voltage VC2[j−1]. If the sort voltage VC2[j] is lower than the voltage VC2[j−1], processing proceeds to step S412. If the sort voltage VC2[j] is not lower than the voltage VC2[j−1], processing proceeds to step S413.

In step S412, the control circuit 135 rearranges voltage values by interchanging the values of voltage VC2[j] and voltage VC2[j−1] and interchanging the values of index[j] and index[j−1]. Upon completion of step S412, processing proceeds to step S413.

In step S413, the control circuit 135 decrements the cell number j by one. Upon completion of step S413, processing proceeds to step S414.

In step S414, the control circuit 135 determines whether the sort cell number j is greater than the cell number i. If the cell number j is greater than the cell number i, processing returns to step S411. If the cell number j is not greater than the cell number i, processing proceeds to step S415.

In step S415, the control circuit 135 increments the cell number i by one. Upon completion of step S415, processing proceeds to step S416.

In step S416, the control circuit 135 determines whether the cell number i is smaller than the maximum cell number N. If the cell number i is smaller than N, processing returns to step S411. If the cell number i is not smaller than N, processing proceeds to step S417.

In step S417, the control circuit 135 sets the cell number i to N. Upon completion of step S417, processing proceeds to step S418.

In step S418, the control circuit 135 determines whether a value obtained by subtracting a voltage VC2[0] from a voltage VC2[i] is not smaller than a predetermined value delta_vc. If the value obtained by subtracting the voltage VC2[0] from the voltage VC2[i] is not smaller than the predetermined value delta_vc, processing proceeds to step S419. If the value obtained by subtracting the voltage VC2[0] from the voltage VC2[i] is smaller than the predetermined value delta_vc, processing proceeds to step S423.

In step S419, the control circuit 135 turns on the cell balance for a battery cell [index[i]]. Upon completion of step S419, processing proceeds to step S420.

In step S420, the control circuit 135 decrements the cell number i by one. Upon completion of step S420, processing proceeds to step S421.

In step S421, the control circuit 135 determines whether the cell number i is greater than 0. If the cell number i is greater than 0, processing returns to step S418. If the cell number i is not greater than 0, processing proceeds to step S422.

In step S422, the control circuit 135 sets the cell number i to N. Upon completion of step S422, processing proceeds to step S423.

In step S423, the control circuit 135 selects a battery cell that is to be used as the power supply for the low-voltage circuit 130. Upon completion of step S423, processing proceeds to step S424. More specifically, the coupling of the VDD multiplexer 121 and the coupling of the VSS multiplexer 123 are respectively switched so as to set the positive electrode of the battery cell [index[i]] to LVDD and set the negative electrode of the battery cell [index[i]] to LVSS.

In step S424, the control circuit 135 sets the interval of a timer. Upon completion of step S424, processing proceeds to step S425.

In step S425, the control circuit 135 drives the timer. Subsequently, when a predetermined period of time elapses, processing returns to step S403.

If, for example, an end-of-discharge voltage VC_MIN=2.5 V, a charging completion voltage VC_MAX=4.7 V, and the power supply voltage range of the low-voltage circuit LVDD-LVSS=2.5 V to 5.0 V so that VC_MIN LVDD_MIN, the low-voltage circuit can be driven by one battery cell. Therefore, the first embodiment can be implemented by selecting a battery cell having as high a battery voltage as possible as the power supply for the low-voltage circuit.

Referring to the flowcharts of FIGS. 5A and 5B, when the voltage difference between a battery cell having the lowest voltage and the other battery cells is not smaller than the predetermined value delta_vc, control is exercised to operate a related-art cell balance circuit in such a manner that the voltage difference between all the battery cells is smaller than delta_vc.

Further, in order to minimize the amount of heat generated by the battery cells during an operation of the cell balance circuit, except when the voltage difference between the battery cell having the lowest voltage and a battery cell having the second lowest voltage is not smaller than delta_vc, control is exercised in such a manner that battery cells subjected to cell balancing are not selected as the power supply for the low-voltage circuit.

When a passive cell balance circuit is used, cell balance control is exercised to prevent the voltages of the battery cells from exceeding a maximum voltage during battery cell charging by discharging a battery cell having a high voltage until it is equal in voltage to a battery cell having a low voltage.

Here, a cell balancing function can be disabled by adjusting the value of delta_vc to a high-voltage value such as the charging completion voltage. Alternatively, a cell balancing operation can be disabled by determining, immediately before comparing the voltages of the battery cells, whether or not to enable or disable the cell balancing function.

Figure 6:
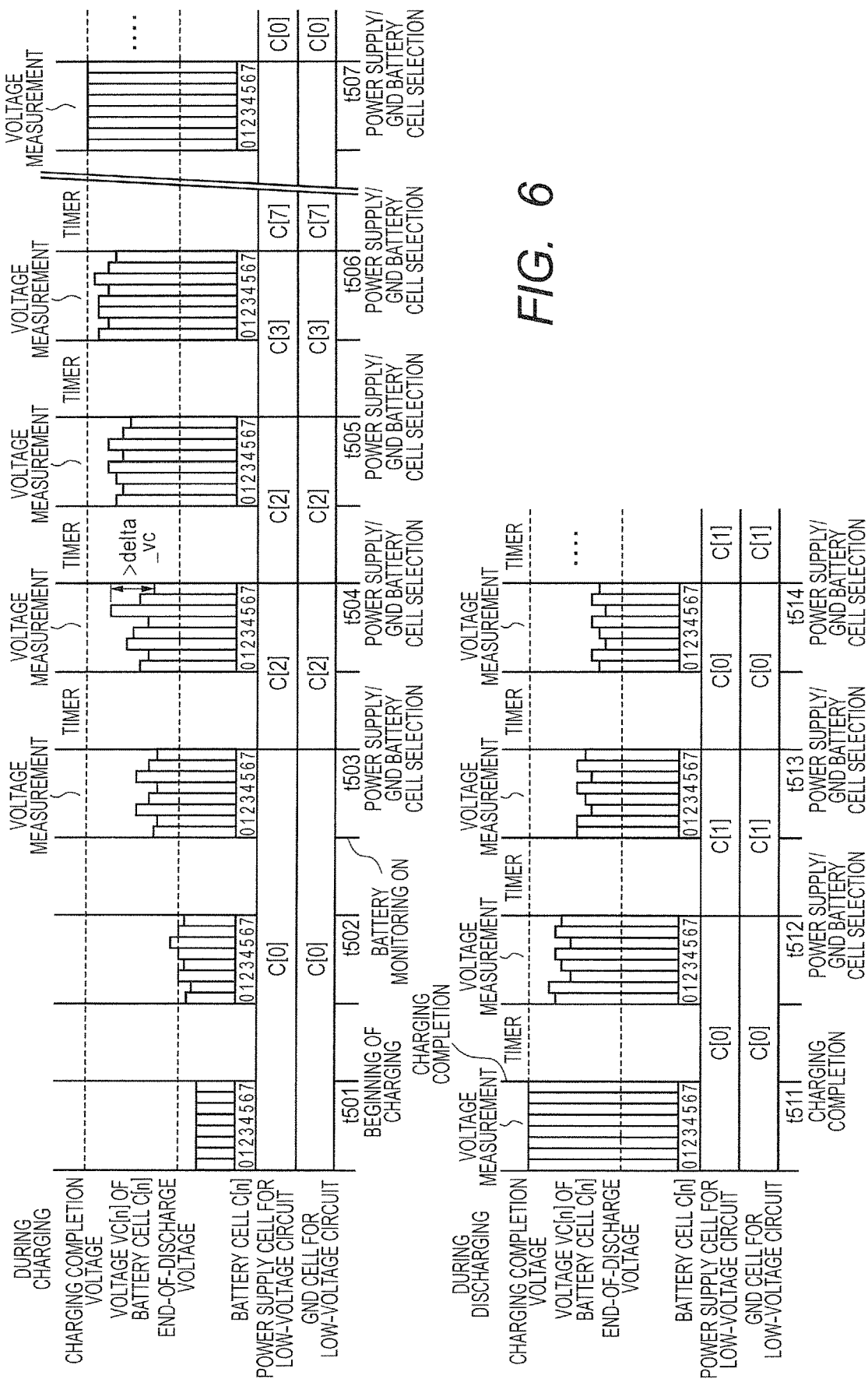
FIG. 6 is a diagrammatic sketch illustrating exemplary transitions of battery voltage monitored by the semiconductor device according to the first embodiment.

Battery voltage transitions during the operations depicted in FIGS. 5A and 5B will now be described. Referring to FIGS. 5A and 5B, a case where the end-of-discharge voltage VC_MIN is not lower than the low-voltage circuit minimum power supply voltage LVDD_MIN will be described. FIG. 6 is a diagrammatic sketch illustrating exemplary transitions of battery voltage monitored by the semiconductor device according to the first embodiment. The upper half of FIG. 6 illustrates battery voltage transitions during charging. The lower half of FIG. 6 illustrates battery voltage transitions during discharging. FIG. 6 illustrates battery voltage transitions in a case where the voltages of eight battery cells C[0]-C[7] having cell numbers 0 to 7 are adjusted.

First of all, battery voltage transitions during charging will be described. At the beginning of charging t501, the voltages of the eight battery cells C[0]-C[7] are all lower than the end-of-discharge voltage.

The battery cell C[0] is selected as an initial power supply for the low-voltage circuit 130. Therefore, if the voltage of the battery cell C[0] is lower than the end-of-discharge voltage, the battery cell C[0] is not able to supply electrical power to the low-voltage circuit 130. The low-voltage circuit 130 includes a circuit that monitors battery cell voltages. Therefore, the circuit for monitoring the battery cell voltages remains stopped until the voltage of the battery cell C[0] is equal to or higher than the end-of-discharge voltage. At time t502, although the battery cell C[4] reaches a voltage equal to or higher than the end-of-discharge voltage, the voltage of the battery cell selected as the initial power supply for the low-voltage circuit 130 is still lower than the end-of-discharge voltage. Therefore, the circuit for monitoring the battery cell voltages is stopped.

At time t503, the voltage of the battery cell C[0] is equal to or higher than the end-of-discharge voltage so that electrical power is supplied to the low-voltage circuit 130. Thus, the monitoring of the battery cell voltages begins. As depicted in FIG. 6, the battery cell C[2], which has the highest voltage among the battery cells C[0]-C[7], is selected as the power supply for the low-voltage circuit 130. At time t503, too, the battery cell C[2] having the highest voltage is similarly selected as the power supply for the low-voltage circuit 130.

At time t504, the battery cell C[5] has the highest voltage. Here, the voltage difference between the highest-voltage battery cell C[5] and the lowest-voltage battery cell C[7] is not smaller than the predetermined threshold value delta_vc. Therefore, the cell balance 110 is turned on so that the battery cell C[2] having the second highest voltage is selected as the power supply for the low-voltage circuit 130.

Subsequently, between time t505 and time t507, the voltages of the battery cells C[0]-C[7] are equalized.

Next, battery voltage transitions during discharging will be described. As depicted in the lower half of FIG. 6, the voltages of the battery cells C[0]-C[7] are equalized at time t511. Further, at time t511, the battery cell C[0] is selected as the initial power supply for the low-voltage circuit 130.

At time t512 at which a predetermined period of time has elapsed since time t511, the battery cell C[1], which has the highest voltage among the battery cells C[0]-C[7], is selected as the power supply for the low-voltage circuit 130.

At time t513 at which a predetermined period of time has elapsed since time t512, the battery cell C[0], which has the highest voltage among the battery cells C[0]-C[7], is selected as the power supply for the low-voltage circuit 130.

In the above-described manner, each time a predetermined period of time elapses, a battery cell having the highest voltage is selected as the power supply for the low-voltage circuit 130.

Figure 7A:
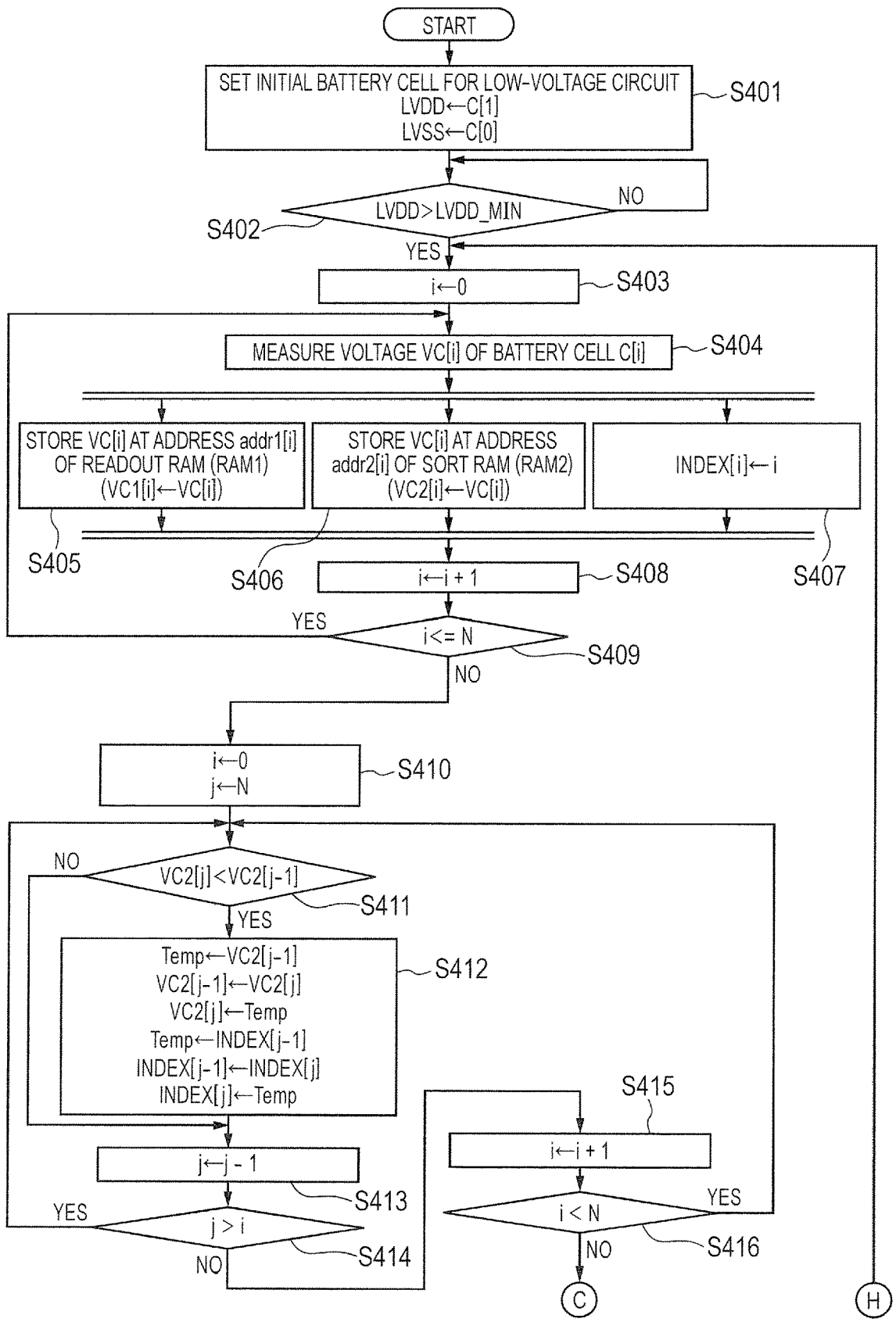
FIG. 7A is a flowchart illustrating an exemplary operation of the semiconductor device according to the first embodiment.
Figure 7B:
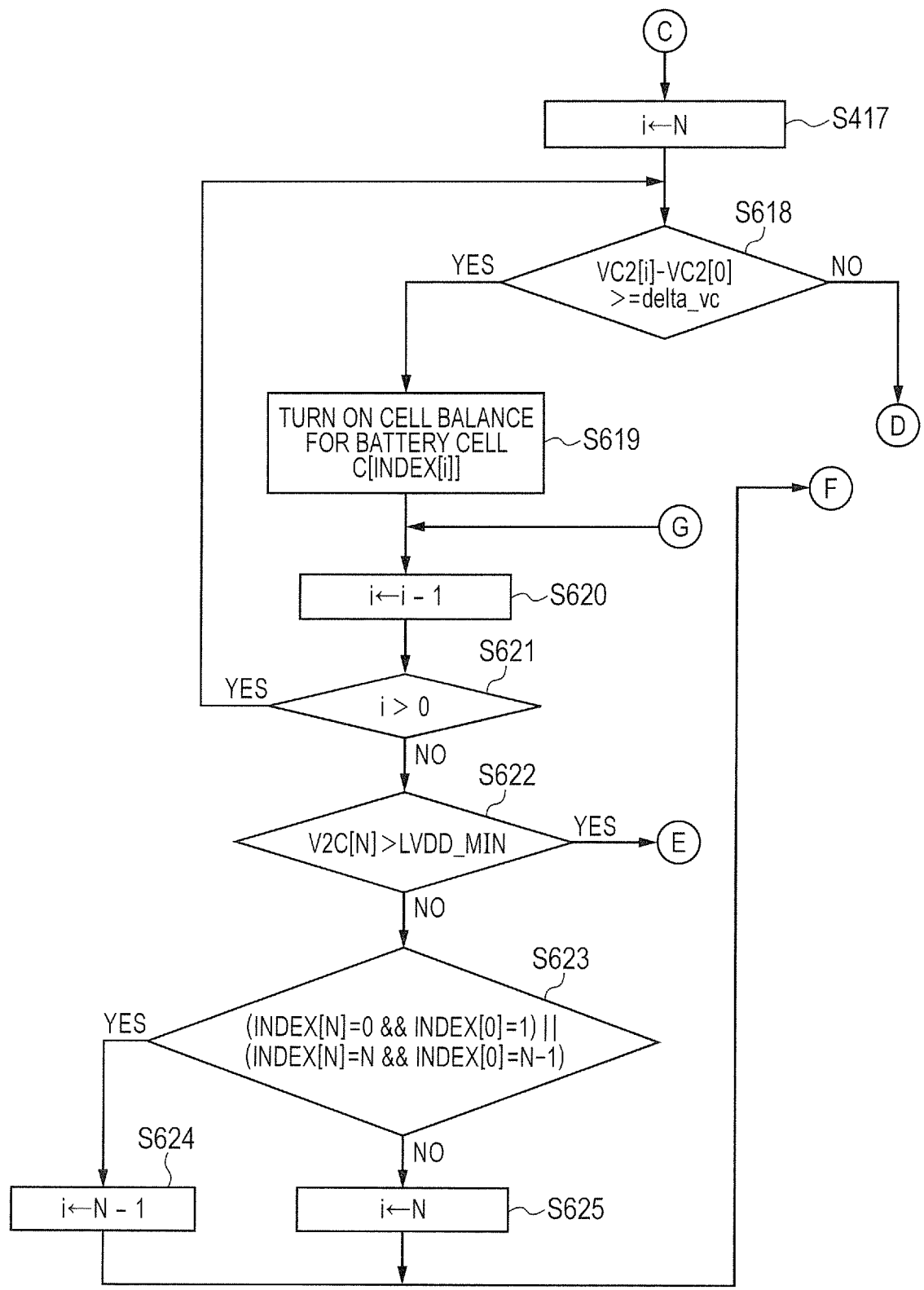
FIG. 7B is a flowchart illustrating an exemplary operation of the semiconductor device according to the first embodiment.
Figure 7C:
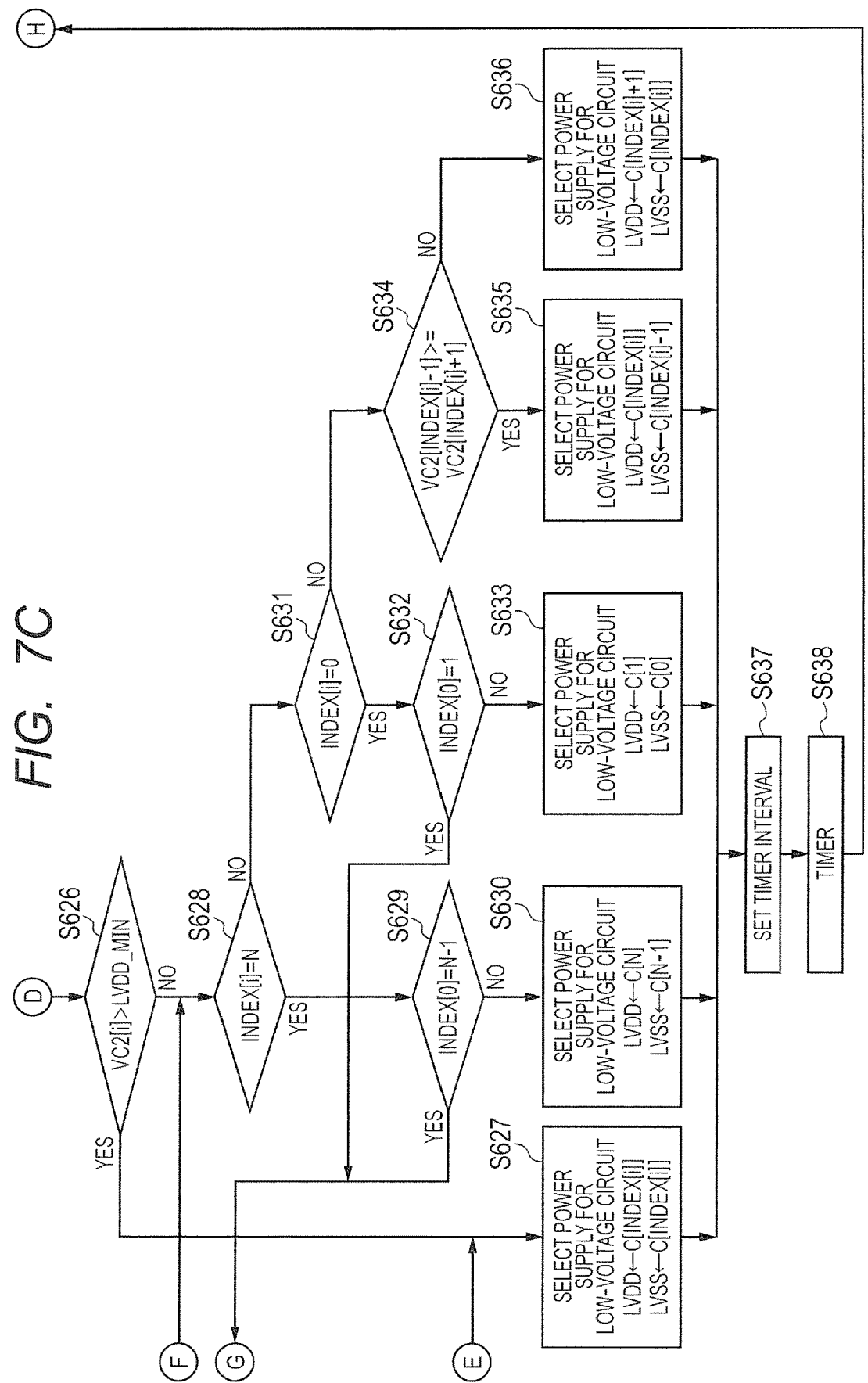
FIG. 7C is a flowchart illustrating an exemplary operation of the semiconductor device according to the first embodiment.

FIGS. 7A, 7B, and 7C are flowcharts illustrating exemplary operations of the semiconductor device according to the first embodiment. Referring to FIGS. 7A, 7B, and 7C, steps S401 to S417 are the same as those depicted in FIGS. 5A and 5B and will not be redundantly described.

In step S417, the control circuit 135 sets the cell number i to N. Upon completion of step S417, processing proceeds to step S618.

In step S618, the control circuit 135 determines whether a value obtained by subtracting the voltage VC2[0] from the voltage VC2[i] is not smaller than the predetermined value delta_vc. If the value obtained by subtracting the voltage VC2[0] from the voltage VC2[i] is not smaller than the predetermined value delta_vc, processing proceeds to step S619. If the value obtained by subtracting the voltage VC2[0] from the voltage VC2[i] is smaller than the predetermined value delta_vc, processing proceeds to step S626.

In step S619, the control circuit 135 turns on the cell balance for the battery cell [index[i]]. Upon completion of step S619, processing proceeds to step S620.

In step S620, the control circuit 135 decrements the cell number i by one. Upon completion of step S620, processing proceeds to step S621.

In step S621, the control circuit 135 determines whether the cell number i is greater than 0. If the cell number i is greater than 0, processing returns to step S618. If the cell number i is not greater than 0, processing proceeds to step S622.

In step S622, the control circuit 135 determines whether the voltage VC2[N] is higher than the predetermined voltage value LVDD_MIN. If the voltage VC2[N] is higher than the predetermined voltage value LVDD_MIN, processing proceeds to step S627. If the voltage VC2[N] is not higher than the predetermined voltage value LVDD_MIN, processing proceeds to step S623.

In step S623, the control circuit 135 determines whether index[N]=0 and index[0]=1 or index[N]=N and index[0]=N−1. If the above condition is satisfied, processing proceeds to step S624. If the above condition is not satisfied, processing proceeds to step S625.

In step S624, the control circuit 135 sets the cell number i to N−1. Upon completion of step S624, processing proceeds to step S628.

In step S625, the control circuit 135 sets the cell number i to N. Upon completion of step S625, processing proceeds to step S628.

In step S626, the control circuit 135 determines whether the voltage VC2[$i$] is higher than the predetermined voltage value LVDD_MIN. If the voltage VC2[$i$] is higher than the predetermined voltage value LVDD_MIN, processing proceeds to step S627. If the voltage VC2[$i$] is not higher than the predetermined voltage value LVDD_MIN, processing proceeds to step S628.

In step S627, the control circuit 135 selects a battery cell that is to be used as the power supply for the low-voltage circuit 130. Upon completion of step S627, processing proceeds to step S637. More specifically, the coupling of the VDD multiplexer 121 and the coupling of the VSS multiplexer 123 are respectively switched so as to set the positive electrode of the battery cell C[index[i]] to LVDD and set the negative electrode of the battery cell C[index[i]] to LVSS.

In step S628, the control circuit 135 determines whether index[i] is equal to N. If index[i] is equal to N, processing proceeds to step S629. If index[i] is not equal to N, processing proceeds to step S631.

In step S629, the control circuit 135 determines whether index[0] is equal to N−1. If index[0] is equal to N−1, processing proceeds to step S620. If index[0] is not equal to N−1, processing proceeds to step S630.

In step S630, the control circuit 135 selects a battery cell that is to be used as the power supply for the low-voltage circuit 130. Upon completion of step S630, processing proceeds to step S637. More specifically, the coupling of the VDD multiplexer 121 and the coupling of the VSS multiplexer 123 are respectively switched so as to set the positive electrode of the battery cell C[N] to LVDD and set the negative electrode of the battery cell C[N−1] to LVSS.

In step S631, the control circuit 135 determines whether index[i] is equal to 0. If index[i] is equal to 0, processing proceeds to step S632. If index[i] is not equal to 0, processing proceeds to step S634.

In step S632, the control circuit 135 determines whether index[0] is equal to 1. If index[0] is equal to 1, processing proceeds to step S620. If index[0] is not equal to 1, processing proceeds to step S634.

In step S633, the control circuit 135 selects a battery cell that is to be used as the power supply for the low-voltage circuit 130. Upon completion of step S633, processing proceeds to step S637. More specifically, the coupling of the VDD multiplexer 121 and the coupling of the VSS multiplexer 123 are respectively switched so as to set the positive electrode of the battery cell C[1] to LVDD and set the negative electrode of the battery cell C[0] to LVSS.

In step S634, the control circuit 135 determines whether VC[index[i]−1] is not lower than VC[index[i]+1]. If VC[index[i]−1] is not lower than VC[index[i]+1], processing proceeds to step S635. If VC[index[i]−1] is lower than VC[index[i]+1], processing proceeds to step S636.

In step S635, the control circuit 135 selects a battery cell that is to be used as the power supply for the low-voltage circuit 130. Upon completion of step S635, processing proceeds to step S637. More specifically, the coupling of the VDD multiplexer 121 and the coupling of the VSS multiplexer 123 are respectively switched so as to set the positive electrode of the battery cell C[index[i]] to LVDD and set the negative electrode of the battery cell C[index[i]−1] to LVSS.

In step S636, the control circuit 135 selects a battery cell that is to be used as the power supply for the low-voltage circuit 130. Upon completion of step S636, processing proceeds to step S637. More specifically, the coupling of the VDD multiplexer 121 and the coupling of the VSS multiplexer 123 are respectively switched so as to set the positive electrode of the battery cell C[index[i]+1] to LVDD and set the negative electrode of the battery cell C[index[i]] to LVSS.

In step S637, the control circuit 135 sets the interval of the timer. Upon completion of step S637, processing proceeds to step S638.

In step S638, the control circuit 135 drives the timer. Subsequently, when a predetermined period of time elapses, processing returns to step S403.

If, for example, the end-of-discharge voltage VC_MIN=2.5 V, the charging completion voltage VC_MAX=4.7 V, and the power supply voltage range of the low-voltage circuit LVDD-LVSS=3.0 V to 6.0 V so that VC_MIN<LVDD_MIN, two battery cells are selected when the battery cell voltage VC=2.5 V to 3.0 V, and one battery cell is selected when the battery cell voltage VC=3.0 V to 4.7 V.

Here, if two battery cells need to be used when the battery cell C[0] has the highest battery voltage and the battery cell C[1] has the lowest battery voltage or when the battery cell C[N] has the highest battery voltage and the battery cell C[N−1] has the lowest battery voltage, a battery cell having the second highest battery voltage and either one of two battery cells coupled to the battery cell having the second highest battery voltage, whichever is higher in battery voltage, are selected.

Further, if the voltage difference between the lowest-voltage battery cell and the other battery cells is not smaller than the preset voltage difference delta_vc, a related-art cell balance circuit is used to adjust the battery cell voltages.

Figure 8:
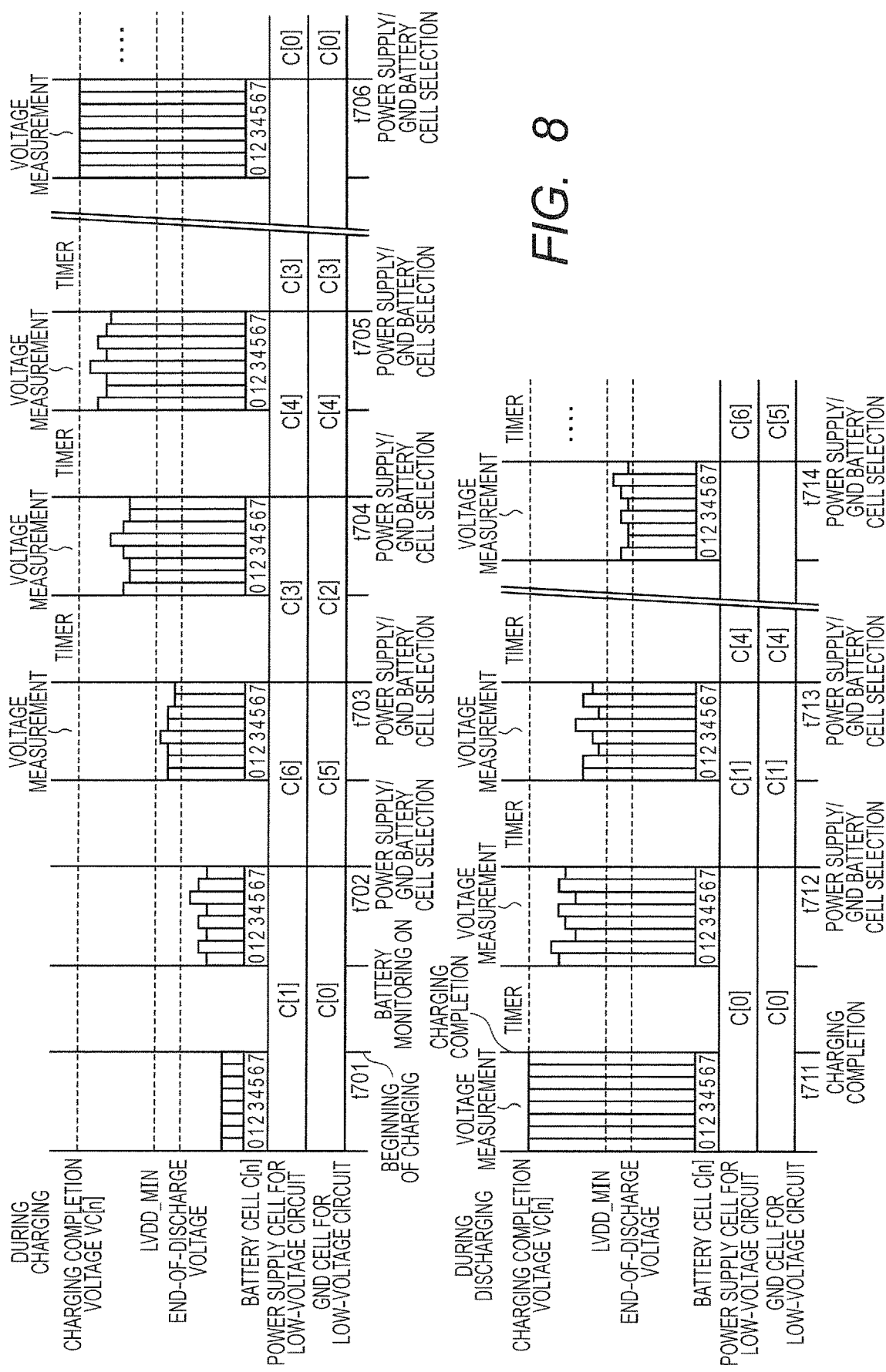
FIG. 8 is a diagrammatic sketch illustrating exemplary transitions of battery voltage monitored by the semiconductor device according to the first embodiment.

An example in which the end-of-discharge voltage VC_MIN is lower than the low-voltage circuit minimum operating voltage LVDD_MIN will now be described. FIG. 8 is a diagrammatic sketch illustrating exemplary transitions of battery voltage monitored by the semiconductor device according to the first embodiment.

Battery voltage transitions during the operations depicted in FIGS. 7A, 7B, and 7C will now be described with reference to FIG. 8. The upper half of FIG. 8 illustrates battery voltage transitions during charging. The lower half of FIG. 8 illustrates battery voltage transitions during discharging. FIG. 8 illustrates battery voltage transitions in a case where the voltages of eight battery cells C[0]-C[7] having cell numbers 0 to 7 are adjusted.

First of all, battery voltage transitions during charging will be described. At the beginning of charging t701, the voltages of the eight battery cells C[0]-C[7] are all lower than the end-of-discharge voltage.

The battery cells C[1], C[0] are selected as initial power supplies for the low-voltage circuit 130. Therefore, if the sum of the voltages VC[1]+VC[0] of the battery cells C[1], C[0] is lower than the minimum operating voltage LVDD_MIN of the low-voltage circuit, the battery cells C[1], C[0] are unable to supply electrical power to the low-voltage circuit 130. The low-voltage circuit 130 includes a circuit that monitors battery cell voltages. Therefore, the circuit for monitoring the battery cell voltages remains stopped until the sum of the voltages VC[1]+VC[0] of the battery cells C[1], C[0] is equal to or higher than the minimum operating voltage.

At time t702, although the voltages VC[1], VC[0] of the battery cells C[1], C[0] are lower than the end-of-discharge voltage, the sum of the voltages VC[1]+VC[0] is not lower than the operating voltage of the low-voltage circuit. Further, during charging, electrical power is supplied from a charging circuit coupled to the battery pack. Therefore, electrical power is supplied to the low-voltage circuit 130 so that the monitoring of battery cell voltages begins. If, at time t703, the voltage of the battery cell C[3], which has the highest voltage among the battery cells C[0]-C[7], is lower than the predetermined threshold value LVDD_MIN, the drive voltage of the low-voltage circuit 130 is not reached by a single battery cell. Consequently, two adjacent battery cells C[3], C[2] are selected as the power supplies for the low-voltage circuit 130.

At time t704, the battery cell C[4] has the highest voltage. As the voltage of the battery cell C[4] is higher than the predetermined threshold value LVDD_MIN, the battery cell C[4] is selected as the power supply for the low-voltage circuit 130.

Subsequently, between time t705 and time t707, the voltages of the battery cells C[0]-C[7] are equalized.

Next, battery voltage transitions during discharging will be described. As depicted in the lower half of FIG. 8, the voltages of the battery cells C[0]-C[7] are equalized at time t711. Further, at time t711, the battery cell C[0] is selected as the initial power supply for the low-voltage circuit 130.

At time t712 at which a predetermined period of time has elapsed since time t711, the battery cell C[1], which has the highest voltage among the battery cells C[0]-C[7], is selected as the power supply for the low-voltage circuit 130.

At time t713 at which a predetermined period of time has elapsed since time t712, the battery cell C[4], which has the highest voltage among the battery cells C[0]-C[7], is selected as the power supply for the low-voltage circuit 130.

At time t714, the voltage of the battery cell C[6], which has the highest voltage among the battery cells C[0]-C[7], is lower than the predetermined threshold value LVDD_MIN. It signifies that the drive voltage of the low-voltage circuit 130 is not reached by a single battery cell. Consequently, two adjacent battery cells C[5], C[6] are selected as the power supplies for the low-voltage circuit 130.

As described above, each time a predetermined period of time elapses, a battery cell having the highest voltage is selected as the power supply for the low-voltage circuit 130. If the drive voltage of the low-voltage circuit 130 is not reached by a single battery cell, adjacent battery cells are selected as the power supplies for the low-voltage circuit 130.

As described above, the semiconductor device according to the first embodiment measures the voltages of the battery cells on an individual basis, and couples one of the battery cells, except for a battery cell having the lowest measured voltage, to the power supply for the low-voltage circuit including the measurement circuit. Therefore, adequate electrical power can be provided to the low-voltage circuit by making use of cell capacity adjustment power. As a result, increased energy efficiency can be provided for cell capacity adjustment.

It should be noted that the MCU 30 may alternatively perform the operation of the control circuit 135, which is depicted in the flowcharts of FIGS. 5A and 5B or FIGS. 7A to 7C. Such an alternative scheme may be implemented by configuring the MCU 30 as depicted in FIG. 4 in replacement of the control circuit 135 depicted in FIG. 3.

Second Embodiment

Figure 9:
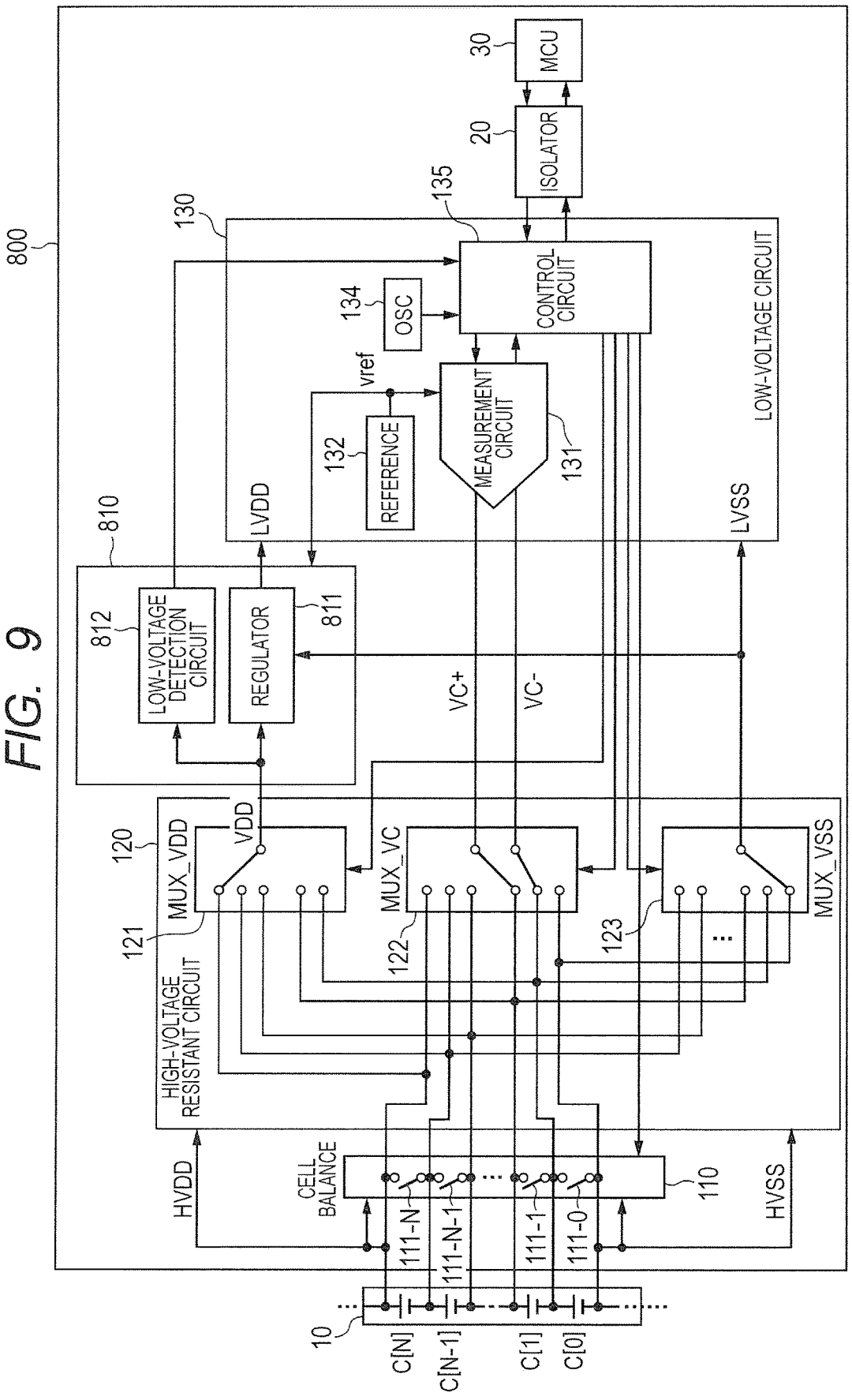
FIG. 9 is a circuit diagram illustrating an example of the semiconductor device according to a second embodiment of the present invention.

FIG. 9 is a circuit diagram illustrating an example of the semiconductor device according to a second embodiment of the present invention. Referring to FIG. 9, the semiconductor device 800 includes the cell balance 110, the high-voltage resistant circuit 120, the low-voltage circuit 130, and a low-voltage supply circuit 810. Elements that are depicted in FIG. 9 and identical with those depicted in FIG. 2 are designated by like reference numerals and will not be redundantly described. The low-voltage supply circuit 810 includes a regulator 811 and a low-voltage detection circuit 812.

The regulator 811 adjusts an inputted voltage to the power supply voltage for the low-voltage circuit 130. It is preferable that the regulator 811 be formed of a series regulator or a switching regulator.

The low-voltage detection circuit 812 detects whether the regulator 811 is able to normally supply the power supply voltage for the low-voltage circuit 130, and outputs the result of detection to the control circuit 135.

Figure 10:
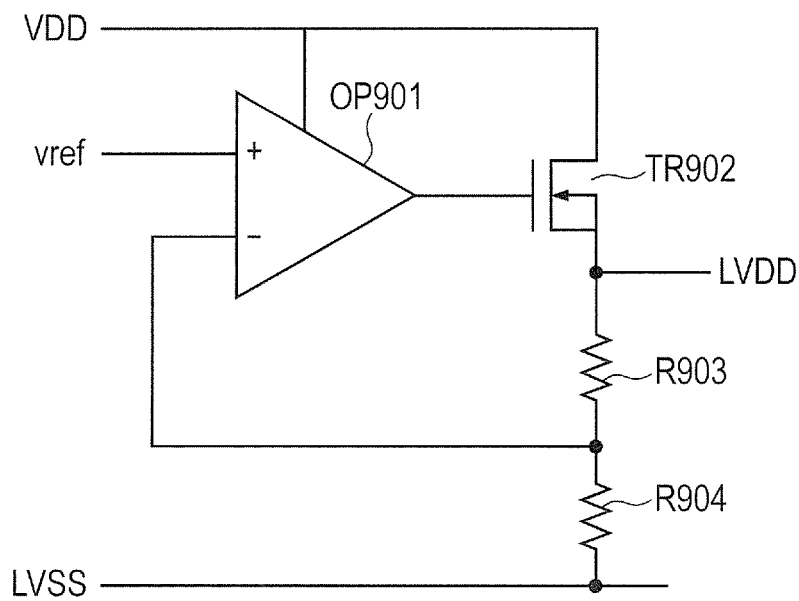
FIG. 10 is a circuit diagram illustrating an example of a regulator of the semiconductor device according to the second embodiment.

FIG. 10 is a circuit diagram illustrating an example of the regulator of the semiconductor device according to the second embodiment. An example in which the regulator 811 is formed of a series regulator will be described with reference to FIG. 10.

Referring to FIG. 10, the regulator 811 includes an operational amplifier OP901, a field-effect transistor TR902, and resistors R903, R904.

A non-inverting input terminal of the operational amplifier OP901 is coupled to the reference 132, and a reference voltage vref is applied to the non-inverting input terminal.

An output terminal of the operational amplifier OP901 is coupled to the gate of the field-effect transistor TR902. The drain of the field-effect transistor TR902 is coupled to a line of a voltage VDD. The source of the field-effect transistor TR902 is coupled to a line of LVDD.

The resistor R903 and the resistor R904 are series-coupled between the gate of the field-effect transistor TR902 and a line of LVSS. A coupling point between the resistor R903 and the resistor R904 is coupled to an inverting input terminal of the operational amplifier OP901.

As the above-described configuration is adopted, the regulator 811 is able to function as a series regulator.

Figure 11:
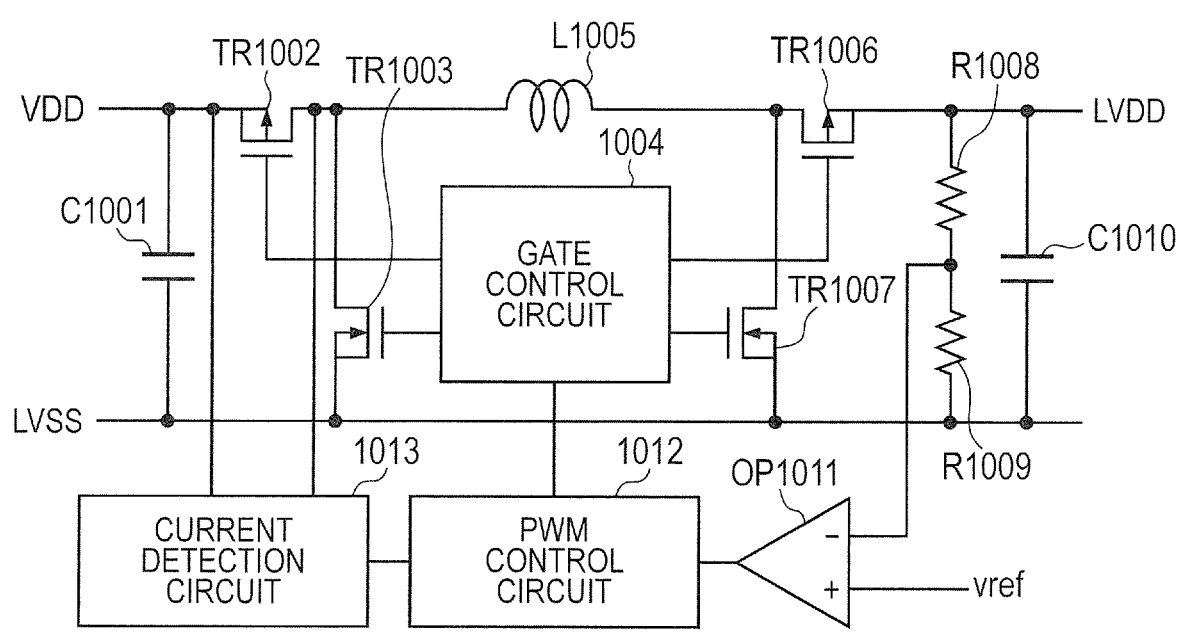
FIG. 11 is a circuit diagram illustrating an example of the regulator of the semiconductor device according to the second embodiment.

FIG. 11 is a circuit diagram illustrating an example of the regulator of the semiconductor device according to the second embodiment. An example in which the regulator 811 is formed of a buck-boost DC-DC converter for a switching regulator will be described with reference to FIG. 11. Referring to FIG. 11, the regulator 811 includes capacitors C1001, C1010, field-effect transistors TR1002, TR1003, TR1006, TR1007, a gate control circuit 1004, an inductor L1005, resistors R1008, R1009, an operational amplifier OP1011, a PWM control circuit 1012, and a current detection circuit 1013.

The field-effect transistor TR1002, the inductor L1005, and the field-effect transistor TR1006 are series-coupled between a VDD line and an LVDD line. Further, the capacitor C1001 and the field-effect transistor TR1003 are parallel-coupled between the VDD line and an LVSS line.

The field-effect transistor TR1007 and the capacitor C1010 are parallel-coupled between the LVDD line and the LVSS line. Further, the resistor R1008 and the resistor R1009 are series-coupled between the LVDD line and the LVSS line. A coupling point between the resistor R1008 and the resistor R1009 is coupled to an inverting input terminal of the operational amplifier OP1011. A non-inverting input terminal of the operational amplifier OP1011 is coupled to the reference 132, and the reference voltage vref is applied to the non-inverting input terminal.

The PWM control circuit 1012 determines the duty ratio of PWM control in accordance with the level of an output from the operational amplifier OP1011 and with a current detected by the current detection circuit 1013. The current detection circuit 1013 detects a VDD line current.

The gate control circuit 1004 determines the switching timing of field-effect transistors TR1002, TR1003, TR1006, TR1007 (that is, the timing of gate voltage application) in accordance with the duty ratio of PWM control.

As the above configuration is adopted, the regulator 811 is able to function as a buck-boost DC-DC converter.

Figure 12A:
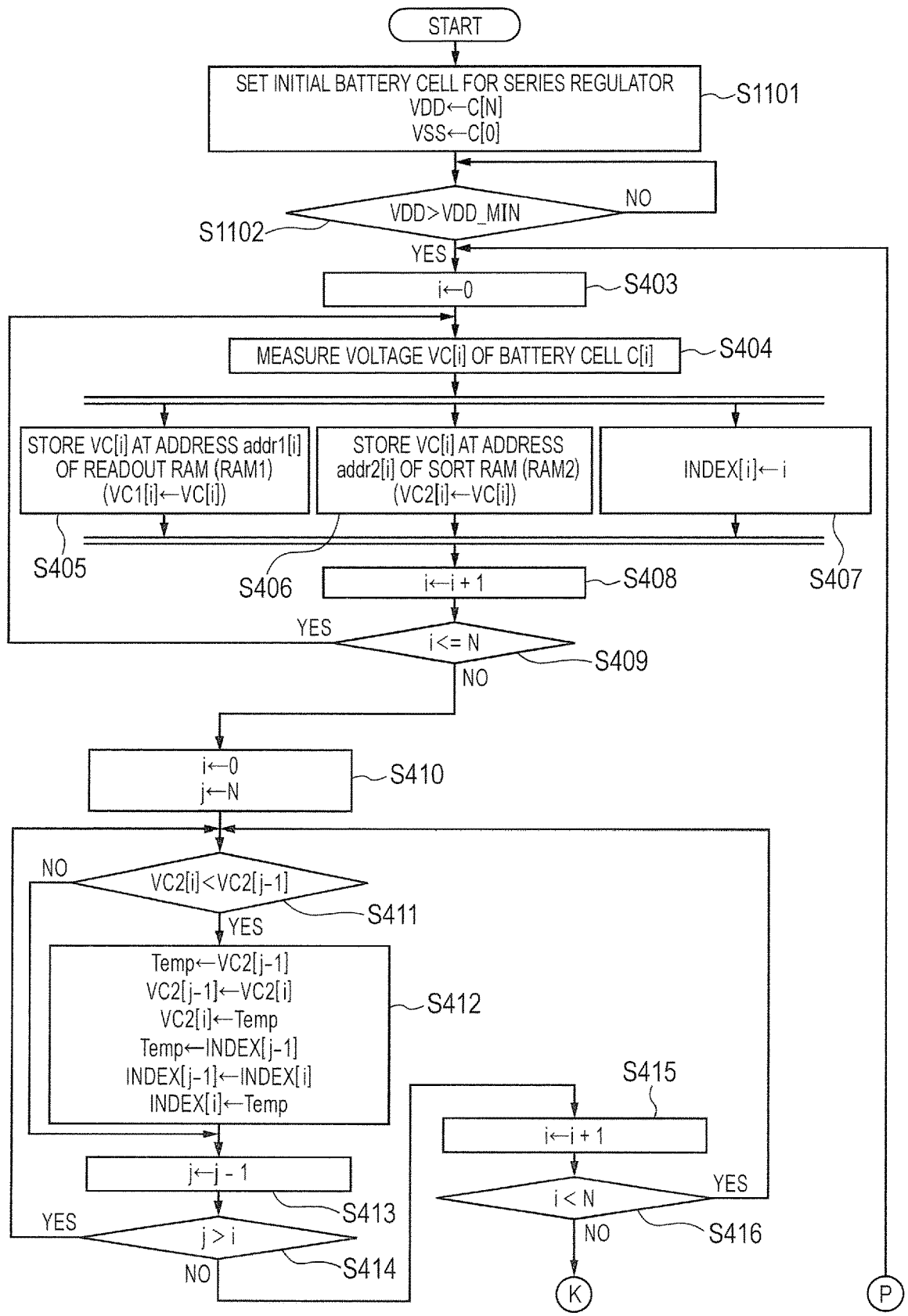
FIG. 12A is a flowchart illustrating an exemplary operation of the semiconductor device according to the second embodiment.
Figure 12C:
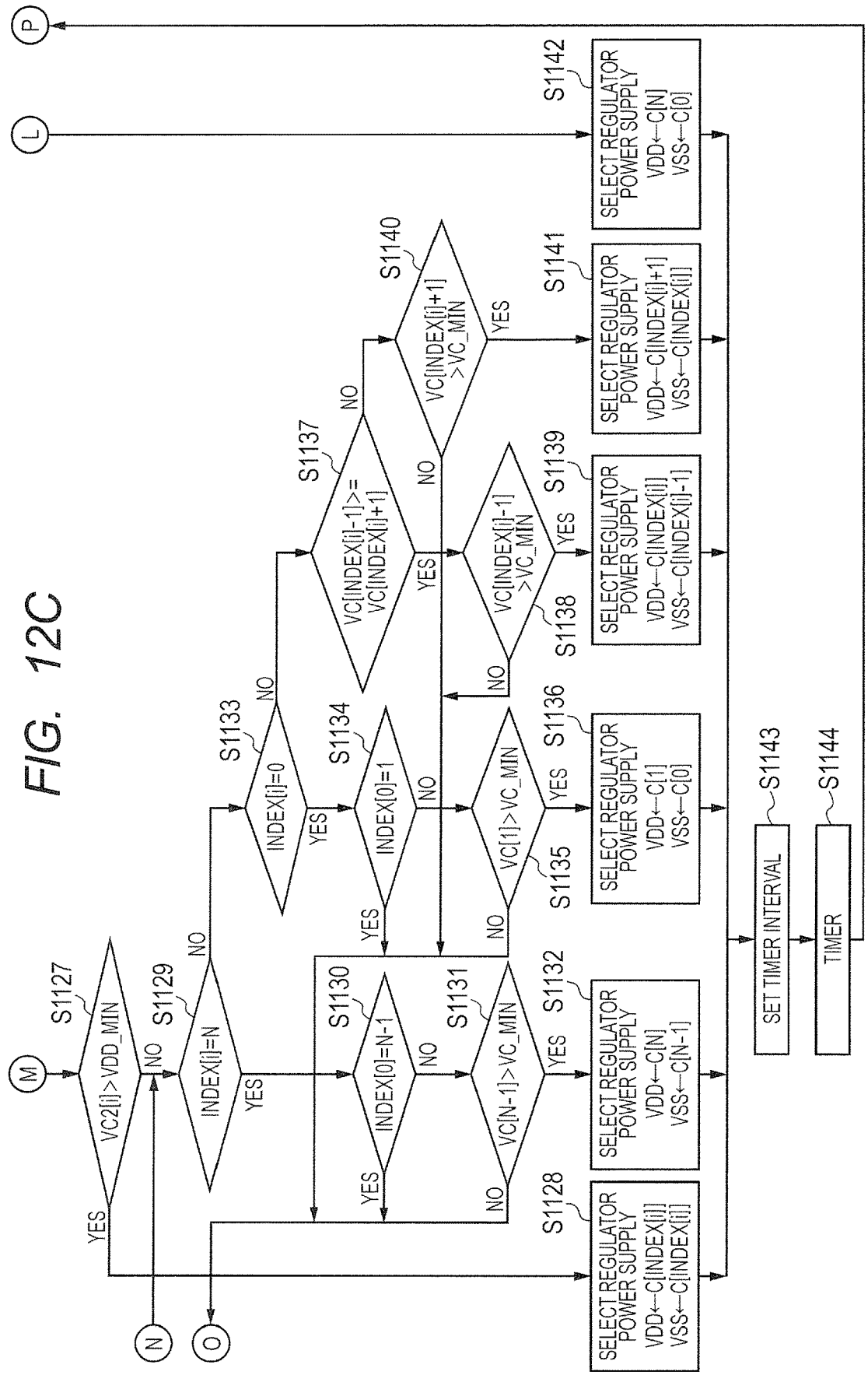
FIG. 12C is a flowchart illustrating an exemplary operation of the semiconductor device according to the second embodiment.

FIGS. 12A, 12B, and 12C are flowcharts illustrating exemplary operations of the semiconductor device according to the second embodiment. Referring to FIGS. 12A, 12B, and 12C, steps S403 to S417 are the same as those depicted in FIGS. 5A and 5B and will not be redundantly described. In FIGS. 12A, 12B, and 12C, VDD denotes the power supply voltage of the regulator 811, and VDD_MIN denotes the minimum operating voltage of the regulator 811.

First of all, in step S1101, the control circuit 135 sets an initial battery cell for the low-voltage circuit that is to be coupled to the series regulator. Upon completion of step S417, processing proceeds to step S1102. For example, the VDD multiplexer 121 and the VSS multiplexer 123 are switched to set the initial battery cell in such a manner that the VDD side is set to the positive electrode of C[N] and that the VSS side is set to the negative electrode of C[0].

In step S1102, the control circuit 135 determines whether the VDD is greater than the predetermined threshold value VDD_MIN. If the VDD is greater than the threshold value VDD_MIN, processing proceeds to step S403. If the VDD is not greater than the threshold value VDD_MIN, processing repeats step S1102.

In step S417, the control circuit 135 sets the cell number i to N. Upon completion of step S417, processing proceeds to step S1118.

In step S1118, the control circuit 135 determines whether the voltage VC2[$i$] is not lower than the predetermined value VC_MIN. If the voltage VC2[$i$] is not lower than the predetermined value VC_MIN, processing proceeds to step S1119. If the voltage VC2[$i$] is lower than the predetermined value VC_MIN, processing proceeds to step S1142.

In step S1119, the control circuit 135 determines whether a value obtained by subtracting the voltage VC2[0] from the voltage VC2[$i$] is not smaller than the predetermined value delta_vc. If the value obtained by subtracting the voltage VC2[0] from the voltage VC2[$i$] is not smaller than the predetermined value delta_vc, processing proceeds to step S1120. If, by contrast, the value obtained by subtracting the voltage VC2[0] from the voltage VC2[$i$] is smaller than the predetermined value delta_vc, processing proceeds to step S1127.

In step S1120, the control circuit 135 turns on the cell balance for the battery cell [index[i]]. Upon completion of step S1120, processing proceeds to step S1121.

In step S1121, the control circuit 135 decrements the cell number i by one. Upon completion of step S1121, processing proceeds to step S1122.

In step S1122, the control circuit 135 determines whether the cell number i is greater than 0. If the cell number i is greater than 0, processing returns to step S1118. If the cell number i is not greater than 0, processing proceeds to step S1123.

In step S1123, the control circuit 135 determines whether index[N]=0 and index[0]=1 or index[N]=N and index[0]=N−1.

If the above condition is satisfied, processing proceeds to step S1124. If the above condition is not satisfied, processing proceeds to step S1125.

In step S1124, the control circuit 135 sets the cell number i to N−1. Upon completion of step S1124, processing proceeds to step S1127.

In step S1125, the control circuit 135 sets the cell number i to N. Upon completion of step S1125, processing proceeds to step S1127.

In step S1127, the control circuit 135 determines whether the voltage VC2[$i$] is higher than the predetermined voltage value VDD_MIN. If the voltage VC2[$i$] is higher than the predetermined voltage value VDD_MIN, processing proceeds to step S1128. If the voltage VC2[$i$] is not higher than the predetermined voltage value VDD_MIN, processing proceeds to step S1129.

In step S1128, the control circuit 135 selects a battery cell that is to be used as the power supply for the low-voltage circuit 130. Upon completion of step S1128, processing proceeds to step S1143. More specifically, the coupling of the VDD multiplexer 121 and the coupling of the VSS multiplexer 123 are respectively switched so as to set the positive electrode of the battery cell C[index[i]] to VDD and set the negative electrode of the battery cell C[index[i]] to VSS.

In step S1129, the control circuit 135 determines whether index[i] is equal to N. If index[i] is equal to N, processing proceeds to step S1130. If index[i] is not equal to N, processing proceeds to step S1133.

In step S1130, the control circuit 135 determines whether index[0] is equal to N−1. If index[0] is equal to N−1, processing proceeds to step S1121. If index[0] is not equal to N−1, processing proceeds to step S1131.

In step S1131, the control circuit 135 determines whether VC[N−1] is greater than the predetermined threshold value VC_MIN. If VC[N−1] is greater than the predetermined threshold value VC_MIN, processing proceeds to step S1132. If VC[N−1] is not greater than the predetermined threshold value VC_MIN, processing proceeds to step S1121.

In step S1132, the control circuit 135 selects a battery cell that is to be used as the power supply for the low-voltage circuit 130. Upon completion of step S1132, processing proceeds to step S1143. More specifically, the coupling of the VDD multiplexer 121 and the coupling of the VSS multiplexer 123 are respectively switched so as to set the positive electrode of the battery cell C[N] to VDD and set the negative electrode of the battery cell C[N−1] to VSS.

In step S1133, the control circuit 135 determines whether index[i] is equal to N. If index[i] is equal to N, processing proceeds to step S1134. If index[i] is not equal to N, processing proceeds to step S1137.

In step S1134, the control circuit 135 determines whether index[0] is equal to 1. If index[0] is equal to 1, processing proceeds to step S1121. If index[0] is not equal to 1, processing proceeds to step S1135.

In step S1135, the control circuit 135 determines whether VC[1] is greater than the predetermined threshold value VC_MIN. If VC[1] is greater than the predetermined threshold value VC_MIN, processing proceeds to step S1136. If VC[1] is not greater than the predetermined threshold value VC_MIN, processing proceeds to step S1121.

In step S1136, the control circuit 135 selects a battery cell that is to be used as the power supply for the low-voltage circuit 130. Upon completion of step S1136, processing proceeds to step S1137. More specifically, the coupling of the VDD multiplexer 121 and the coupling of the VSS multiplexer 123 are respectively switched so as to set the positive electrode of the battery cell C[1] to VDD and set the negative electrode of the battery cell C[0] to VSS.

In step S1137, the control circuit 135 determines whether VC[index[i]−1] is not smaller than VC[index[i]+1]. If VC[index[i]−1] is not smaller than VC[index[i]+1], processing proceeds to step S1138. If VC[index[i]−1] is smaller than VC[index[i]+1], processing proceeds to step S1140.

In step S1138, the control circuit 135 determines whether VC[index[i]−1] is greater than the predetermined threshold value VC_MIN. If VC[index[i]−1] is greater than the predetermined threshold value VC_MIN, processing proceeds to step S1139. If VC[index[i]−1] is not greater than the predetermined threshold value VC_MIN, processing proceeds to step S1121.

In step S1139, the control circuit 135 selects a battery cell that is to be used as the power supply for the low-voltage circuit 130. Upon completion of step S1139, processing proceeds to step S1143.

More specifically, the coupling of the VDD multiplexer 121 and the coupling of the VSS multiplexer 123 are respectively switched so as to set the positive electrode of the battery cell C[index[i]] to VDD and set the negative electrode of the battery cell C[index[i]−1] to VSS.

In step S1140, the control circuit 135 determines whether VC[index[i]+1] is greater than the predetermined threshold value VC_MIN. If VC[index[i]+1] is greater than the predetermined threshold value VC_MIN, processing proceeds to step S1141. If VC[ index[i]+1] is not greater than the predetermined threshold value VC_MIN, processing proceeds to step S1121.

In step S1141, the control circuit 135 selects a battery cell that is to be used as the power supply for the low-voltage circuit 130. Upon completion of step S1141, processing proceeds to step S1143. More specifically, the coupling of the VDD multiplexer 121 and the coupling of the VSS multiplexer 123 are respectively switched so as to set the positive electrode of the battery cell C[index[i]+1] to VDD and set the negative electrode of the battery cell C[index[i]] to VSS.

In step S1142, the control circuit 135 selects a battery cell that is to be used as the power supply for the low-voltage circuit 130. Upon completion of step S1142, processing proceeds to step S1143. More specifically, the coupling of the VDD multiplexer 121 and the coupling of the VSS multiplexer 123 are respectively switched so as to set the positive electrode of the battery cell C[N] to VDD and set the negative electrode of the battery cell C[0] to VSS.

In step S1143, the control circuit 135 sets the interval of the timer. Upon completion of step S1143, processing proceeds to step S1144.

In step S1144, the control circuit 135 drives the timer. Subsequently, when a predetermined period of time elapses, processing returns to step S403.

If, in the above case, the voltage VC[i] of the selected battery cell is different from the end-of-discharge voltage VC_MIN, a circuit stop process can be performed by an external control circuit MCU during discharging or electrical power for driving the low-voltage circuit can be obtained from the charging circuit coupled to the battery pack during charging.

Figure 13:
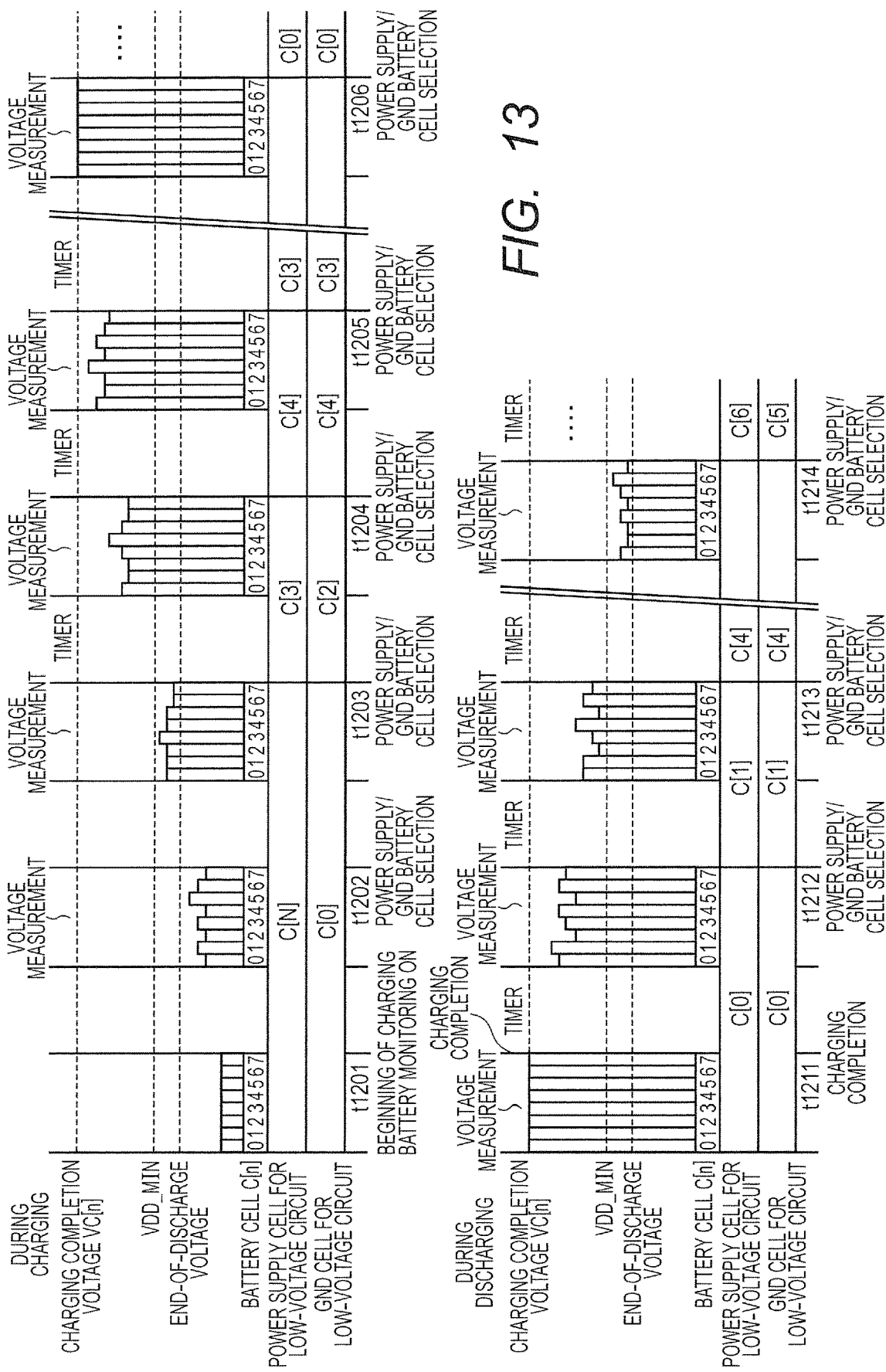
FIG. 13 is a diagrammatic sketch illustrating exemplary transitions of battery voltage monitored by the semiconductor device according to the second embodiment.

Battery voltage transitions during the operations depicted in FIGS. 12A, 12B, and 12C will now be described. FIG. 13 is a diagrammatic sketch illustrating exemplary transitions of battery voltage monitored by the semiconductor device according to the second embodiment. The upper half of FIG. 13 illustrates battery voltage transitions during charging. The lower half of FIG. 13 illustrates battery voltage transitions during discharging. FIG. 13 illustrates battery voltage transitions in a case where the voltages of eight battery cells C[0]-C[7] having cell numbers 0 to 7 are adjusted.

First of all, battery voltage transitions during charging will be described. At the beginning of charging t1201, the voltages of the eight battery cells C[0]-C[7] are lower than the end-of-discharge voltage. However, the sum of the voltages of battery cells C[0]-C[7] is not lower than the predetermined threshold value VDD_MIN. Therefore, a battery monitoring function is turned on. In this instance, the voltages of battery cells C[0]-C[7], which provide electrical power for the battery monitoring circuit, are supplied from the charging circuit coupled to the battery pack.

Even at time t1202, which is the beginning of charging, the voltages of the eight battery cells C[0]-C[7] are all lower than the end-of-discharge voltage. The positive electrode of the battery cell C[N] is set to VDD, and the negative electrode of the battery cell C[0] is set to VSS.

At time t1203, the voltages of the battery cells C[0]-C[7] are not lower than the end-of-discharge voltage. However, the voltages of the battery cells C[0]-C[7] are lower than the predetermined threshold value VDD_MIN. Therefore, two adjacent battery cells are selected as the power supplies for the low-voltage circuit 130.

At time t1204, the battery cell C[4] has the highest voltage. As the voltage of the battery cell C[4] is higher than the predetermined threshold value VDD_MIN, the battery cell C[4] is selected as the power supply for the low-voltage circuit 130.

Subsequently, between time t1205 and time 1206, the voltages of the battery cells C[0]-C[7] are equalized.

Next, battery voltage transitions during discharging will be described. As depicted in the lower half of FIG. 13, the voltages of the battery cells C[0]-C[7] are equalized at time t1211. Further, at time t1211, the battery cell C[0] is selected as the initial power supply for the low-voltage circuit 130.

At time t1212 at which a predetermined period of time has elapsed since time t1211, the battery cell C[1], which has the highest voltage among the battery cells C[0]-C[7], is selected as the power supply for the low-voltage circuit 130. Similarly, at time t1213 at which a predetermined period of time has elapsed since time t1212, the battery cell C[4], which has the highest voltage among the battery cells C[0]-C[7], is selected as the power supply for the low-voltage circuit 130.

At time t1214 at which a predetermined period of time has elapsed since time t1213, the voltages of the battery cells C[0]-C[7] are lower than the predetermined threshold value VDD_MIN. Therefore, two adjacent battery cells are selected as the power supplies for the low-voltage circuit 130.

As described above, each time a predetermined period of time elapses, a battery cell having the highest voltage is selected as the power supply for the low-voltage circuit 130. If the voltage of the highest-voltage battery cell is lower than the minimum operating voltage of the low-voltage circuit 130, two adjacent battery cells are selected as the power supplies for the low-voltage circuit 130.

When a series regulator is used as the regulator for the low-voltage circuit, energy equivalent to the product of the potential difference (VDD−LVDD) between an input voltage VDD and an output voltage LVDD and a consumption current of the low-voltage circuit is consumed as heat loss. However, the heat loss can be reduced by selecting an appropriate battery cell to reduce the potential difference (VDD−LVDD) between the input voltage VDD and the output voltage LVDD.

Figure 14A:
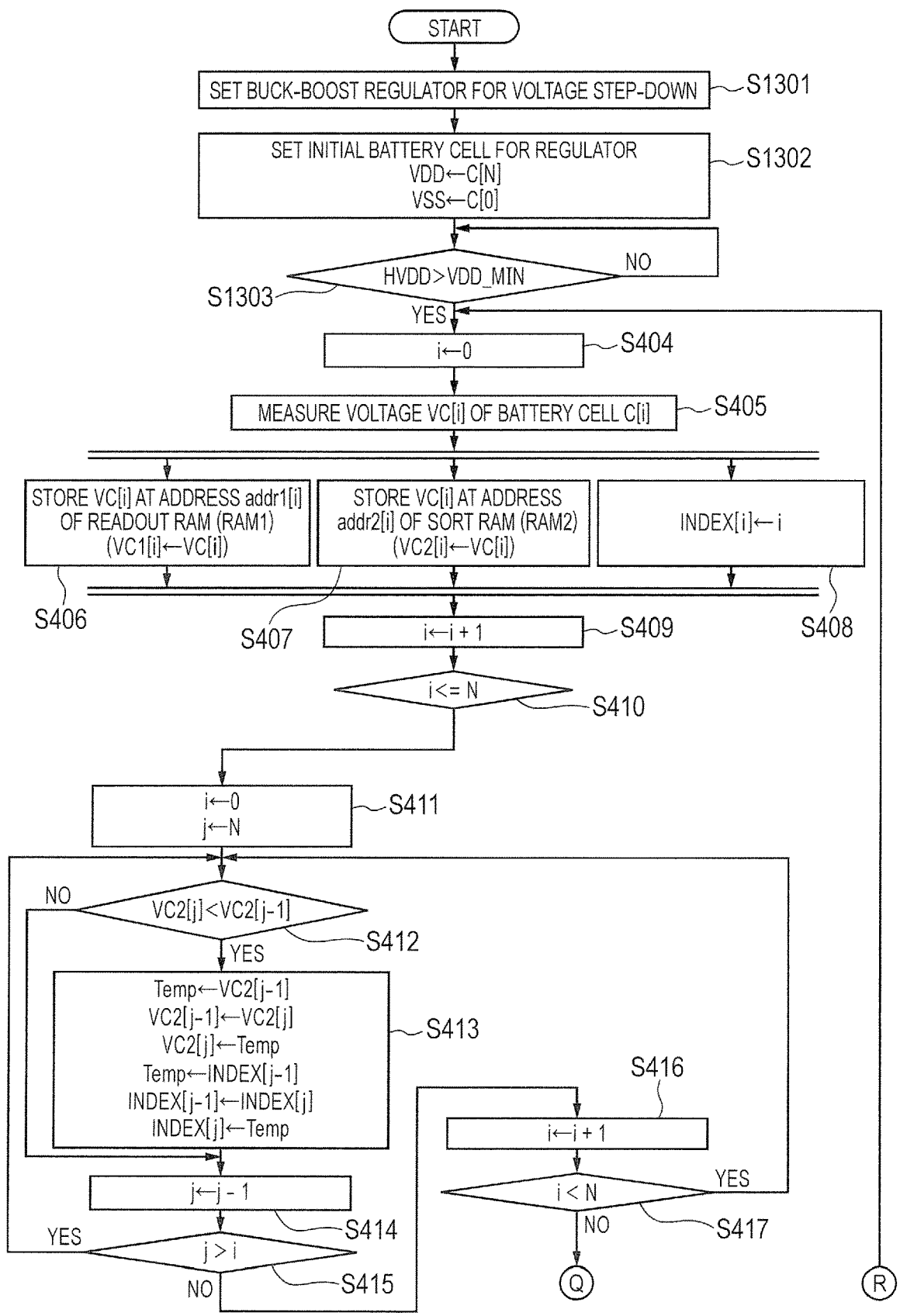
FIG. 14A is a flowchart illustrating an exemplary operation of the semiconductor device according to the second embodiment.
Figure 14B:
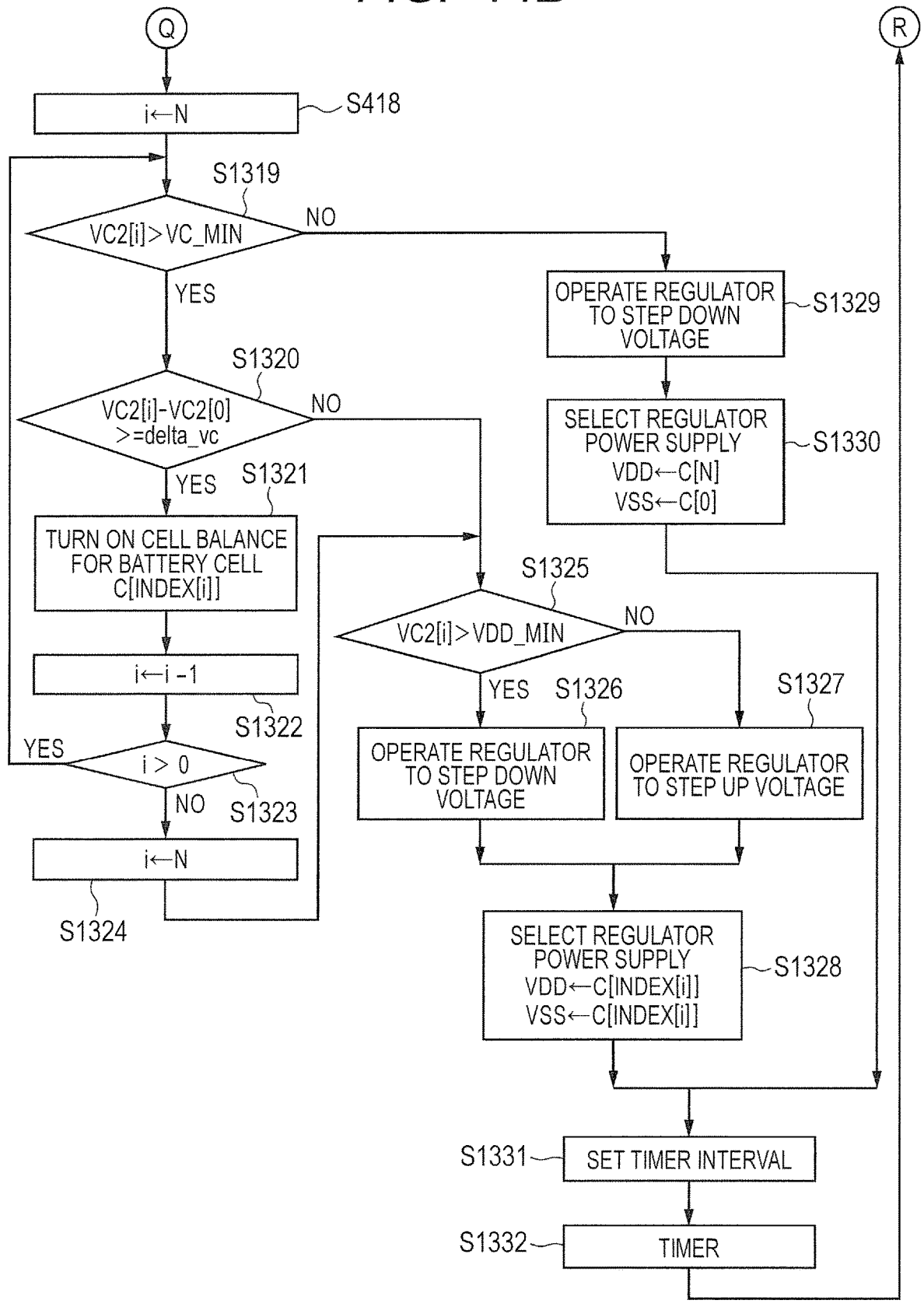
FIG. 14B is a flowchart illustrating an exemplary operation of the semiconductor device according to the second embodiment.

A case where the regulator is of a buck-boost type will now be described. FIGS. 14A and 14B are flowcharts illustrating exemplary operations of the semiconductor device according to the second embodiment. Referring to FIGS. 14A and 14B, steps S403 to S417 are the same as those depicted in FIGS. 5A and 5B and will not be redundantly described.

First of all, in step S1301, the control circuit 135 sets the buck-boost regulator for voltage step-down. Upon completion of step S1301, processing proceeds to step S1302.

In step S1302, the control circuit 135 sets the initial battery cell for the low-voltage circuit that is to be coupled to the regulator. Upon completion of step S1302, processing proceeds to step S1303. For example, the VDD multiplexer 121 and the VSS multiplexer 123 are switched to set the initial battery cell in such a manner that the VDD side is set to the positive electrode of C[N] and that the VSS side is set to the negative electrode of C[0].

In step S1303, the control circuit 135 determines whether the VDD is greater than the predetermined threshold value VDD_MIN. If the VDD is greater than the threshold value VDD_MIN, processing proceeds to step S403. If the VDD is not greater than the threshold value VDD_MIN, processing repeats step S1303.

In step S418, the control circuit 135 sets the cell number i to N. Upon completion of step S418, processing proceeds to step S1319.

In step S1319, the control circuit 135 determines whether the voltage VC2[i] is not lower than the predetermined value VC_MIN. If the voltage VC2[i] is not lower than the predetermined value VC_MIN, processing proceeds to step S1320. If, by contrast, the voltage VC2[i] is lower than the predetermined value VC_MIN, processing proceeds to step S1329.

In step S1320, the control circuit 135 determines whether a value obtained by subtracting the voltage VC2[0] from the voltage VC2[i] is not smaller than the predetermined value delta_vc. If the value obtained by subtracting the voltage VC2[0] from the voltage VC2[i] is not smaller than the predetermined value delta_vc, processing proceeds to step S1321. If, by contrast, the value obtained by subtracting the voltage VC2[0] from the voltage VC2[i] is smaller than the predetermined value delta_vc, processing proceeds to step S1325.

In step S1321, the control circuit 135 turns on the cell balance for the battery cell [index[i]]. Upon completion of step S1321, processing proceeds to step S1322.

In step S1322, the control circuit 135 decrements the cell number i by one. Upon completion of step S1322, processing proceeds to step S1323.

In step S1323, the control circuit 135 determines whether the cell number i is greater than 0. If the cell number i is greater than 0, processing returns to step S1319. If the cell number i is not greater than 0, processing proceeds to step S1324.

In step S1324, the control circuit 135 sets the cell number i to N. Upon completion of step S1324, processing proceeds to step S1325.

In step S1325, the control circuit 135 determines whether the voltage VC2[i] is not lower than the predetermined value VC_MIN. If the voltage VC2[i] is not lower than the predetermined value VC_MIN, processing proceeds to step S1326. If, by contrast, the voltage VC2[i] is lower than the predetermined value VC_MIN, processing proceeds to step S1327.

In step S1326, the control circuit 135 sets the regulator 811 for voltage step-down. Upon completion of step S1326, processing proceeds to step S1328.

In step S1327, the control circuit 135 sets the regulator 811 for voltage step-up. Upon completion of step S1327, processing proceeds to step S1328.

In step S1328, the control circuit 135 selects a battery cell that is to be used as the power supply for the low-voltage circuit 130. Upon completion of step S1328, processing proceeds to step S1331. More specifically, the coupling of the VDD multiplexer 121 and the coupling of the VSS multiplexer 123 are respectively switched so as to set the positive electrode of the battery cell C[index[i]] to VDD and set the negative electrode of the battery cell C[index[i] to VSS.

Further, in step S1329, the control circuit 135 sets a buck-boost series regulator for voltage step-down. Upon completion of step S1329, processing proceeds to step S1330.

In step S1330, the control circuit 135 sets a battery cell for the low-voltage circuit that is to be coupled to the series regulator. Upon completion of step S1330, processing proceeds to step S1331. For example, the VDD multiplexer 121 and the VSS multiplexer 123 are switched to set the battery cell in such a manner that the VDD side is set to the positive electrode of C[N] and that the VSS side is set to the negative electrode of C[0].

In step S1331, the control circuit 135 sets the interval of the timer. Upon completion of step S1331, processing proceeds to step S1332.

In step S1332, the control circuit 135 drives the timer. Subsequently, when a predetermined period of time elapses, processing returns to step S403.

Figure 15:
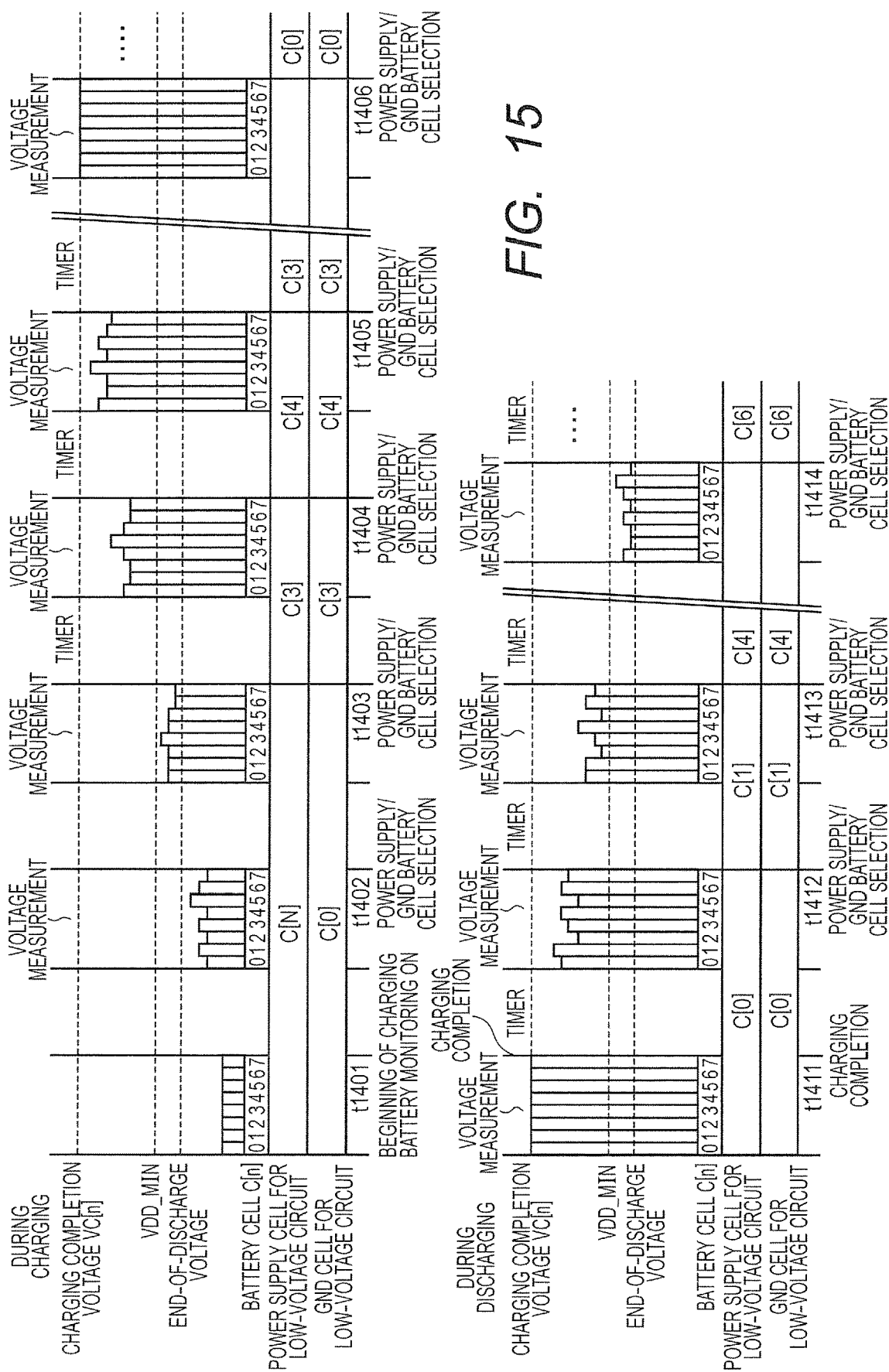
FIG. 15 is a diagrammatic sketch illustrating exemplary transitions of battery voltage monitored by the semiconductor device according to the second embodiment.

Battery voltage transitions during the operations depicted in FIGS. 14A and 14B will now be described. FIG. 15 is a diagrammatic sketch illustrating exemplary transitions of battery voltage monitored by the semiconductor device according to the second embodiment. The upper half of FIG. 15 illustrates battery voltage transitions during charging. The lower half of FIG. 15 illustrates battery voltage transitions during discharging. FIG. 15 illustrates battery voltage transitions in a case where the voltages of eight battery cells C[0]-C[7] having cell numbers 0 to 7 are adjusted.

First of all, battery voltage transitions during charging will be described. At the beginning of charging t1401, the voltages of the eight battery cells C[0]-C[7] are lower than the end-of-discharge voltage. However, the sum of the voltages of battery cells C[0]-C[7] is not lower than the predetermined threshold value VDD_MIN. Therefore, the battery monitoring function is turned on. As the battery cells C[0]-C[7] are in a charged state, the electrical power for the battery monitoring circuit is supplied from the charging circuit coupled to the battery pack.

Even at time t1402, which is the beginning of charging, the voltages of the eight battery cells C[0]-C[7] are all lower than the end-of-discharge voltage. Therefore, the positive electrode of the battery cell C[N] is set to VDD, and the negative electrode of the battery cell C[0] is set to VSS.

At time t1403, the voltages of the battery cells C[0]-C[7] are not lower than the end-of-discharge voltage. However, the voltage of the battery cell C[3], which has the highest voltage, is lower than the predetermined threshold value VDD_MIN. Therefore, the series regulator performs a voltage step-up operation.

At time t1404, the battery cell C[4] has the highest voltage. As the voltage of the battery cell C[4] is higher than the predetermined threshold value VDD_MIN, the battery cell C[4] is selected as the power supply for the low-voltage circuit 130. As the voltage of the battery cell C[4] is higher than the predetermined threshold value VDD_MIN, the series regulator performs a voltage step-down operation.

Subsequently, between time t1405 and time 1406, the voltages of the battery cells C[0]-C[7] are equalized.

Next, battery voltage transitions during discharging will be described. As depicted in the lower half of FIG. 15, the voltages of the battery cells C[0]-C[7] are equalized at time t1411. Further, at time t1411, the battery cell C[0] is selected as the initial power supply for the low-voltage circuit 130.

At time t1412 at which a predetermined period of time has elapsed since time t1411, the battery cell C[1], which has the highest voltage among the battery cells C[0]-C[7], is selected as the power supply for the low-voltage circuit 130.

At time t1413 at which a predetermined period of time has elapsed since time t1412, the battery cell C[4], which has the highest voltage among the battery cells C[0]-C[7], is selected as the power supply for the low-voltage circuit 130.

At time t1414 at which a predetermined period of time has elapsed since time t1413, the battery cell C[6], which has the highest voltage among the battery cells C[0]-C[7], is selected as the power supply for the low-voltage circuit 130. In this instance, the voltage of the battery cell C[6] is lower than the predetermined threshold value VDD_MIN. Therefore, the series regulator performs a voltage step-up operation.

As described above, the semiconductor device according to the second embodiment includes a regulator that adjusts the voltage of a battery cell selected by a multiplexer to the power supply voltage of a low-voltage circuit. Consequently, the semiconductor device according to the second embodiment is capable of equalizing the voltage values of all battery cells.

Third Embodiment

Figure 16:
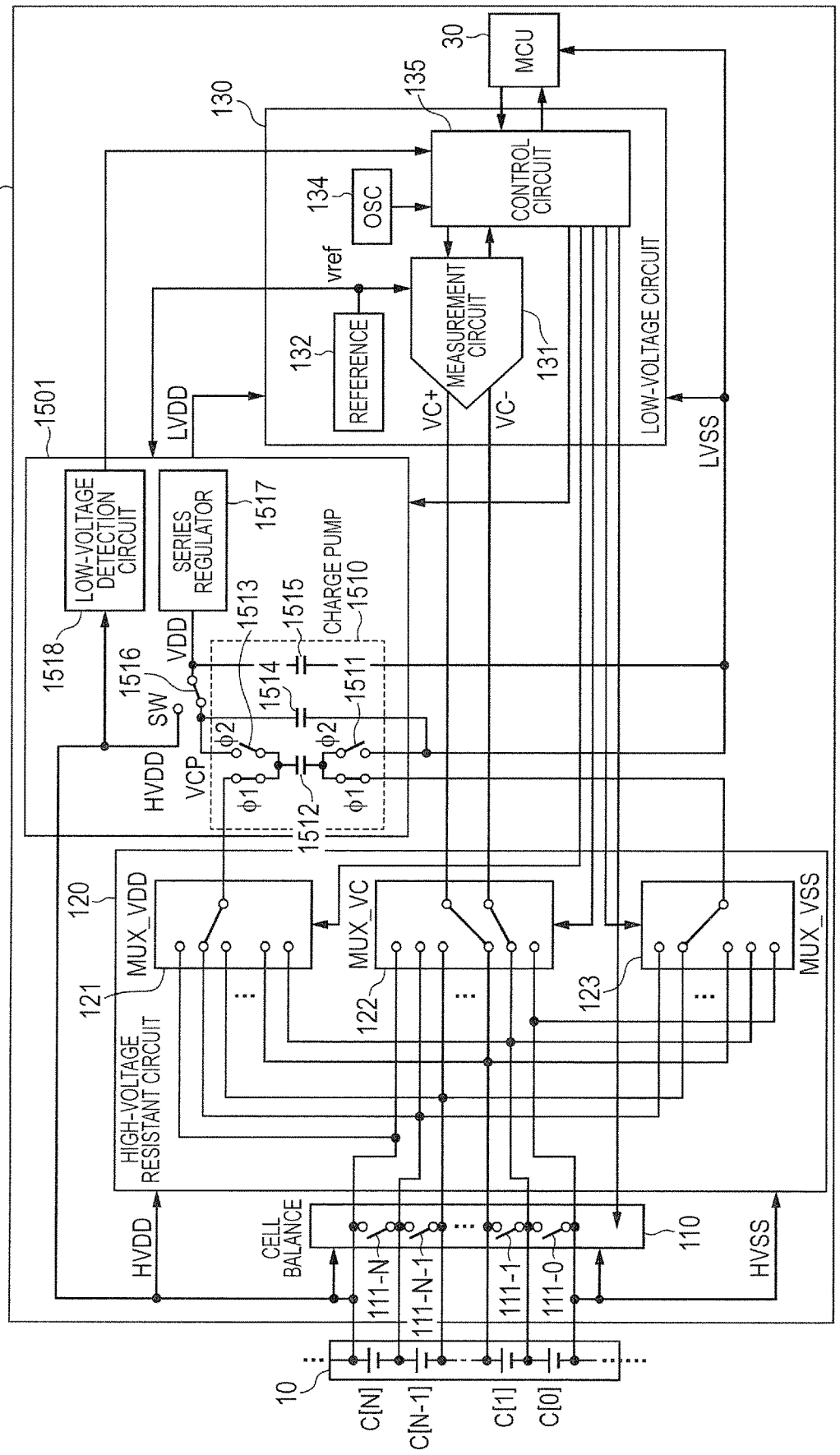
FIG. 16 is a circuit diagram illustrating an example of the semiconductor device according to a third embodiment of the present invention.

FIG. 16 is a circuit diagram illustrating an example of the semiconductor device according to a third embodiment of the present invention. Referring to FIG. 16, the semiconductor device 1500 includes the cell balance 110, the high-voltage resistant circuit 120, the low-voltage circuit 130, and a low-voltage supply circuit 1501. Elements that are depicted in FIG. 16 and identical with those depicted in FIG. 2 are designated by like reference numerals and will not be redundantly described.

The low-voltage supply circuit 1501 includes a charge pump circuit 1510, a switch 1516, a series regulator 1517, and a low-voltage detection circuit 1518.

The charge pump circuit 1510 includes a switch 1511, a capacitor 1512, a switch 1513, and a capacitor 1515. Although only one capacitor 1512 is depicted for the charge pump circuit 1510, the charge pump circuit 1510 is formed of a related-art charge pump that is capable of performing voltage step-up and voltage step-down operations in accordance with an input/output voltage.

The common terminal of the switch 1511 is coupled to the capacitor 1512. A first selection terminal of the switch 1511 is coupled to the VSS multiplexer 123. A second selection terminal of the switch 1511 is coupled to the capacitor 1515, the GND of the low-voltage circuit 130, and the GND of the MCU 30.

The capacitor 1512 stores the electrical charge of a selected battery cell C[0]-C[N].

The common terminal of the switch 1513 is coupled to the capacitor 1512. A first selection terminal of the switch 1513 is coupled to the VDD multiplexer 121. A second selection terminal of the switch 1513 is coupled to a selection terminal of the switch 1516.

The capacitor 1515 supplies electrical power to the low-voltage circuit 130 while the capacitor 1512 stores the electrical charges of the battery cells C[0]-C[N]. A capacitor 1514 smoothes an output voltage VCP of the charge pump circuit 1510.

The switch 1516 selects either an HVDD line to which the battery cells C[0]-C[N] are series-coupled or a charge pump to which a capacitor 821 is to be coupled, and couples the selection to the series regulator 1517.

The series regulator 1517 adjusts an input voltage to the power supply voltage for the low-voltage circuit 130.

The low-voltage detection circuit 1518 detects whether the voltage between the negative electrode of the battery cell C[0] and the positive electrode of the battery cell C[N] enables the series regulator 1517 to normally supply the power supply voltage for the low-voltage circuit 130, and outputs the result of detection to the control circuit 135.

Figure 17A:
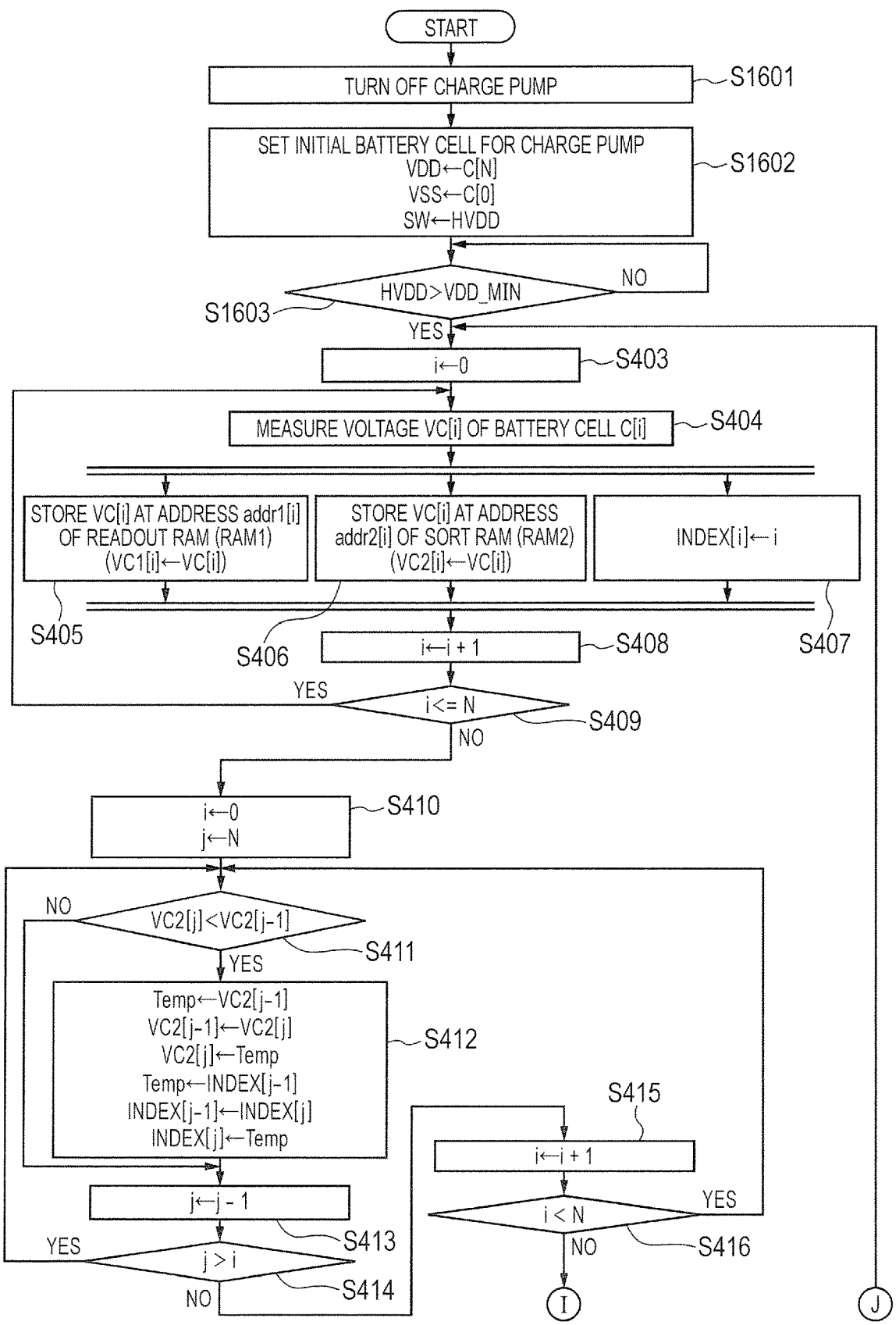
FIG. 17A is a flowchart illustrating an exemplary operation of the semiconductor device according to the third embodiment.
Figure 17B:
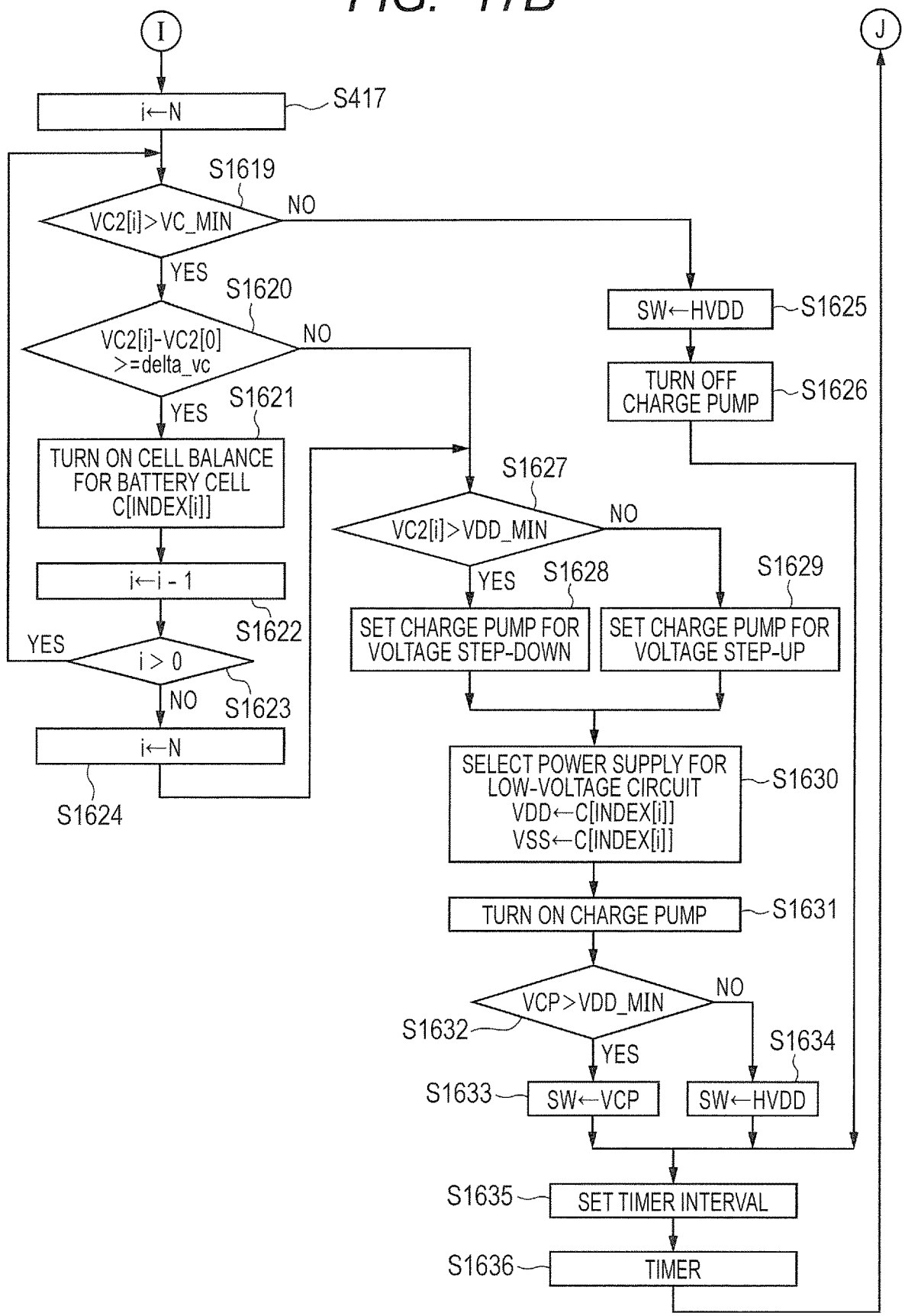
FIG. 17B is a flowchart illustrating an exemplary operation of the semiconductor device according to the third embodiment.

Operations of the semiconductor device 1500 will now be described. FIGS. 17A and 17B are flowcharts illustrating exemplary operations of the semiconductor device according to the third embodiment.

First of all, in step S1601, the control circuit 135 turns off the charge pump circuit 1510. Upon completion of step S1601, processing proceeds to step S1602.

In step S1602, the control circuit 135 sets an initial battery cell that is to be coupled to the charge pump circuit 1510. Upon completion of step S1602, processing proceeds to step S1603. For example, the initial battery cell is set in such a manner that the VDD side is set to the positive electrode of C[N] and that the VSS side is set to the negative electrode of C[0]. Further, the switch 1516 is set so that an HVDD side, that is, the positive electrode of C[N], is coupled to the capacitor 1515 and the series regulator 1517.

In step S1603, a check is performed to determine whether the HVDD is greater than the predetermined threshold value VDD_MIN. If the HVDD is greater than the threshold value VDD_MIN, processing proceeds to step S403. If the HVDD is not greater than the threshold value VDD_MIN, processing repeats step S1603.

In step S403, the control circuit 135 sets a cell number i targeted for measurement to 0. Upon completion of step S403, processing proceeds to step S404.

Steps S404 to S417 are the same as those depicted in FIGS. 5A and 5B. Therefore, they are designated by the same numbers and will not be redundantly described.

In step S417, the control circuit 135 sets the cell number i to N. Upon completion of step S417, processing proceeds to step S1619.

In step S1619, the control circuit 135 determines whether the voltage VC2[$i$] is not lower than the predetermined value VC_MIN. If the voltage VC2[$i$] is not lower than the predetermined value VC_MIN, processing proceeds to step S1620. If, by contrast, the voltage VC2[$i$] is lower than the predetermined value VC_MIN, processing proceeds to step S1625.

In step S1620, the control circuit 135 determines whether a value obtained by subtracting the voltage VC2[0] from the voltage VC2[$i$] is not smaller than the predetermined value delta_vc. If the value obtained by subtracting the voltage VC2[0] from the voltage VC2[$i$] is not smaller than the predetermined value delta_vc, processing proceeds to step S1621. If, by contrast, the value obtained by subtracting the voltage VC2[0] from the voltage VC2[$i$] is smaller than the predetermined value delta_vc, processing proceeds to step S1627.

In step S1621, the control circuit 135 turns on the cell balance for the battery cell [index[i]]. Upon completion of step S1621, processing proceeds to step S1622.

In step S1622, the control circuit 135 decrements the cell number i by one. Upon completion of step S1622, processing proceeds to step S1623.

In step S1623, the control circuit 135 determines whether the cell number i is greater than 0. If the cell number i is greater than 0, processing returns to step S1619. If the cell number i is not greater than 0, processing proceeds to step S1624.

In step S1624, the control circuit 135 sets the cell number i to N. Upon completion of step S1624, processing proceeds to step S1627.

In step S1625, the control circuit 135 couples the HVDD side, that is, the positive electrode of C[N], to the capacitor 1515 and the series regulator 1517. Upon completion of step S1625, processing proceeds to step S1626.

In step S1626, the control circuit 135 turn off the charge pump circuit 1510. Upon completion of step S1626, processing proceeds to step S1635.

In step S1627, the control circuit 135 determines whether the voltage VC2[$i$] is not lower than the predetermined value VDD_MIN.

If the voltage VC2[$i$] is not lower than the predetermined value VDD_MIN, processing proceeds to step S1628. If, by contrast, the voltage VC2[$i$] is lower than the predetermined value VDD_MIN, processing proceeds to step S1629.

In step S1628, the control circuit 135 sets the charge pump circuit 1510 for voltage step-down. Upon completion of step S1628, processing proceeds to step S1630.

In step S1629, the control circuit 135 sets the charge pump circuit 1510 for voltage step-up. Upon completion of step S1629, processing proceeds to step S1630.

In step S1630, the control circuit 135 selects a battery cell that is to be used as the power supply for the charge pump. Upon completion of step S1630, processing proceeds to step S1631. More specifically, setup is performed so that the positive and negative electrodes of the battery cell C[index[i]] are respectively coupled to the first selection terminal of the switch 1513 and the first selection terminal of the switch 1511.

In step S1631, the charge pump circuit 1510 is turned on. Upon completion of step S1631, processing proceeds to step S1632.

In step S1632, the control circuit 135 determines whether the voltage VCP of the charge pump circuit 1510 is not lower than the predetermined value VDD_MIN. If the voltage VCP is not lower than the predetermined value VDD_MIN, processing proceeds to step S1633. If, by contrast, the voltage VCP is lower than the predetermined value VDD_MIN, processing proceeds to step S1634.

In step S1633, the switch 1516 is switched to a VCP position. Upon completion of step S1633, processing proceeds to step S1634. More specifically, the switch is 1516 is switched so that the charge pump circuit 1510 is coupled to the capacitor 1515 and the series regulator 1517.

In step S1634, the switch 1516 is switched to an HVDD position. Upon completion of step S1634, processing proceeds to step S1635.

In step S1635, the control circuit 135 sets the interval of the timer. Upon completion of step S1635, processing proceeds to step S1636.

In step S1636, the control circuit 135 drives the timer. Subsequently, when a predetermined period of time elapses, processing returns to step S403.

Figure 18:
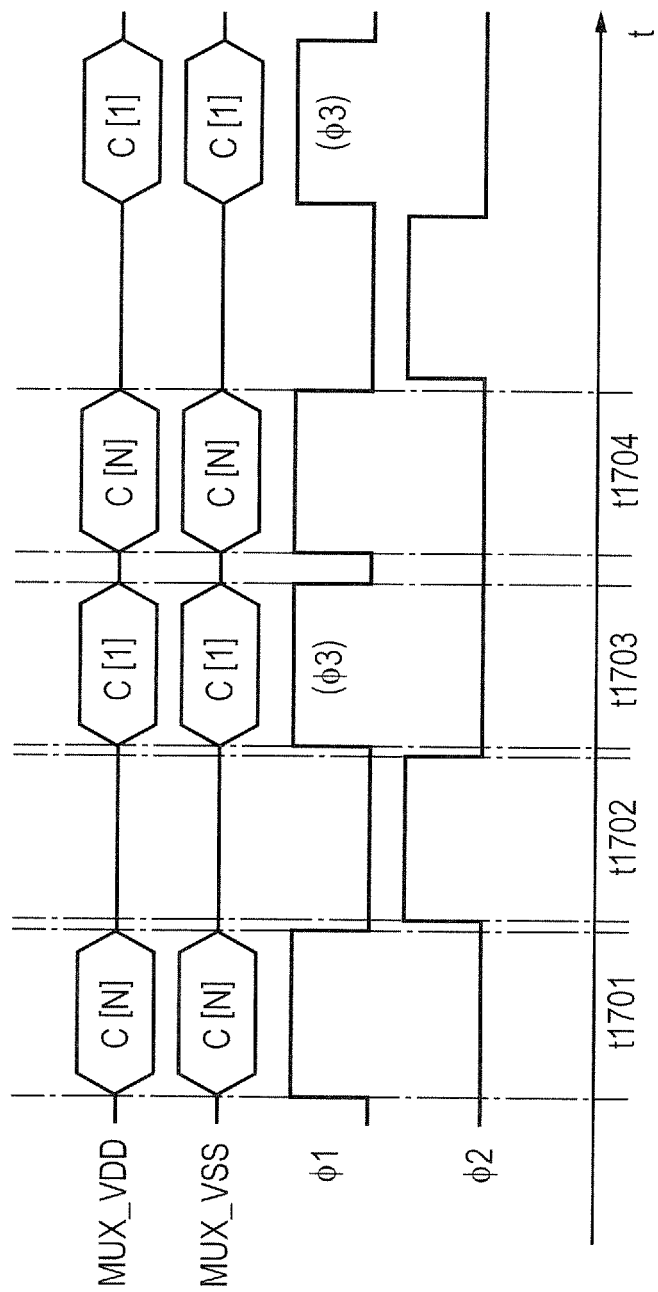
FIG. 18 is a timing diagram illustrating an exemplary operation of the semiconductor device according to the third embodiment.
Figure 19:
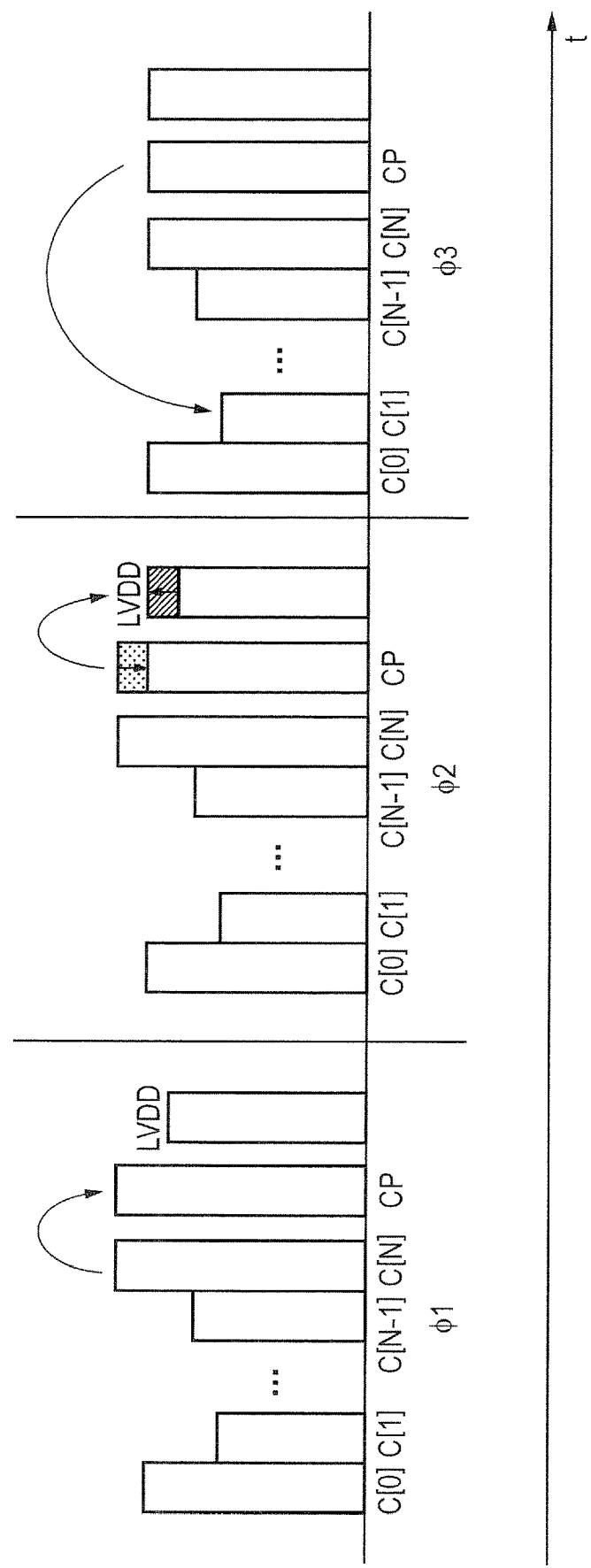
FIG. 19 is a diagrammatic sketch illustrating exemplary transitions of battery voltage monitored by the semiconductor device according to the third embodiment.

The above-described operation adjusts the capacities of the battery cells. Timing of each operation will now be described. FIG. 18 is a timing diagram illustrating an exemplary operation of the semiconductor device according to the third embodiment. Here, it is assumed as depicted in FIG. 19 that the battery cell C[N] having the highest voltage is selected as the power supply for the low-voltage circuit 135, and that the battery cell C[1] has the lowest voltage.

First of all, during a period t1701, the battery cell C[N] is coupled to the capacitor 1512, which functions as a charge pump, and the electrical charge of the battery cell C[N] is stored in the charge pump 1512.

During a period t1702 after the storage of the electrical charge, the capacitor 1512 is uncoupled from the battery cell C[N] and coupled to the capacitor 1515. The electrical charge (part of the electrical charge) stored in the battery cell C[N] is transferred to the capacitor 1515.

During a period t1703 after the transfer of the electrical charge, the capacitor 1512 is uncoupled from the capacitor 1515 and coupled to the battery cell C[1]. The capacitor 1512 then supplies stored electrical charge (part of the stored electrical charge) to the battery cell C[1] as electrical power.

Next, during a period t1704, the capacitor 1512 is uncoupled from the battery cell C[1] and coupled to the battery cell C[N]. Then, a battery cell for supplying an electrical charge to the capacitor 1512 is similarly selected to store the electrical charge in the capacitor 1512. Subsequently, the electrical charge is transferred from the capacitor 1512 to the capacitor 1515 so that the capacitor 1515 to which the electrical charge is transferred supplies electrical power to the low-voltage circuit 130 while the capacitor 1512 supplies stored electrical charge (part of the stored electrical charge), as electrical power, to the battery cell C[1] having the lowest voltage.

FIG. 19 is a diagrammatic sketch illustrating exemplary transitions of battery voltage monitored by the semiconductor device according to the third embodiment. As depicted in FIG. 19, in a state ϕ1 where the charge pump 1512 is coupled to the battery cell C[N] (having the highest voltage among the battery cells), the electrical charge of the battery cell C[N] is transferred to the charge pump 1512 so that the charge pump 1512 has the same voltage as the battery cell C[N].

Next, in a state ϕ2 where the charge pump 1512 is coupled to the capacitor 1515, the electrical charge stored in the charge pump 1512 is transferred to the capacitor 1515. The voltage of the capacitor 1515 is then equal to the voltage of the charge pump 1512.

Then, in a state ϕ3 where electrical power is supplied from the capacitor 1515 to the low-voltage circuit 130, the charge pump 1512 is coupled to the battery cell C[1] (having the highest voltage among the battery cells). The electrical charge remaining in the charge pump 1512 is transferred to the battery cell C[1].

As described above, the semiconductor device according to the third embodiment includes a charge pump that raises the voltage of a battery cell and supplies electrical power from the battery cell to a power supply for the low-voltage circuit. Therefore, even when the voltage of the battery cell is lower than the power supply voltage of the low-voltage circuit, the semiconductor device according to the third embodiment is able to supply electrical power from the battery cell to the low-voltage circuit.

Further, the semiconductor device according to the third embodiment includes a capacitor that is able to transfer the electrical charge of a charge pump, and supplies electrical power to a power supply for the low-voltage circuit through the capacitor. Therefore, even while the electrical charge of a battery cell is stored in the charge pump, electrical power can be supplied to the power supply for the low-voltage circuit. Furthermore, the semiconductor device according to the third embodiment is also able to supply electrical power from a high-voltage battery cell to a low-voltage battery cell. Therefore, an active cell balance circuit can be implemented to provide improved energy efficiency.

Fourth Embodiment

Figure 20:
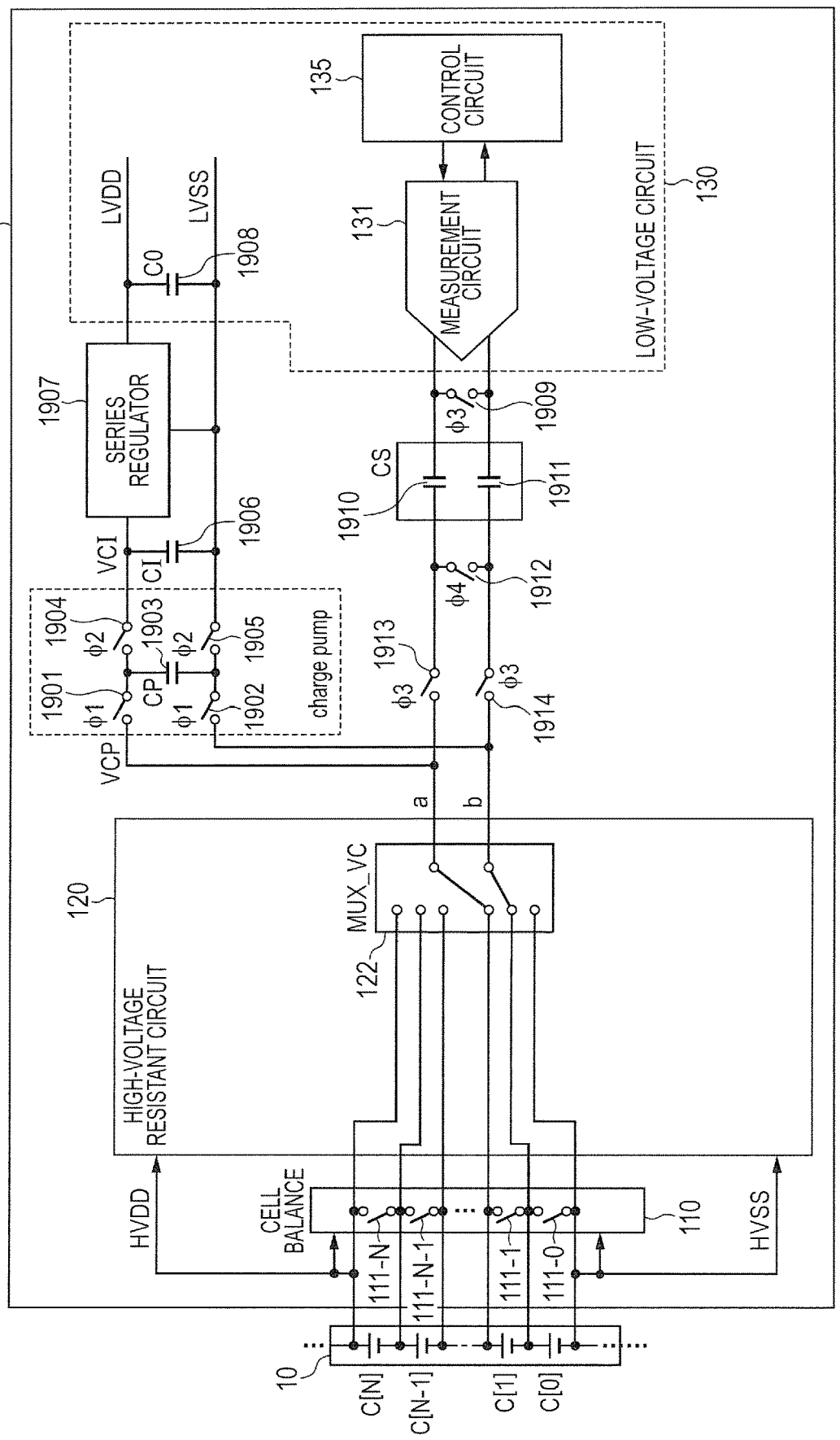
FIG. 20 is a circuit diagram illustrating an example of the semiconductor device according to a fourth embodiment of the present invention.

FIG. 20 is a circuit diagram illustrating an example of the semiconductor device according to a fourth embodiment of the present invention. Referring to FIG. 20, the semiconductor device 1900 includes the cell balance 110, the high-voltage resistant circuit 120, the low-voltage circuit 130, switches 1901, 1902, 1904, 1905, 1909, 1912, 1913, 1914, capacitors 1903, 1906, 1908, 1910, 1911, and a series regulator 1907. Elements that are depicted in FIG. 20 and identical with those depicted in FIG. 2 are designated by like reference numerals and will not be redundantly described.

The switches 1901, 1904 are series-coupled between a common terminal a of the multiplexer 122 and an input terminal of the series regulator 1907. Further, the switches 1902, 1905 are series-coupled between a common terminal b of the multiplexer 122 and the input terminal of the series regulator 1907.

The capacitors 1903, 1906 are parallel-coupled between the common terminal a of the multiplexer 122 and the common terminal b of the multiplexer 122. The capacitor 1903 is coupled between a coupling line for the switches 1901, 1904 and a coupling line for the switches 1902, 1905. The capacitor 1906 is coupled between a coupling line for the switch 1904 and the input terminal of the series regulator 1907 and a coupling line for the switch 1905 and the common terminal of the series regulator 1907. As depicted in FIG. 20, a charge pump is formed by a circuit including the switches 1901, 1902, 1904, 1905 and the capacitor 1903. Here, although the capacitor 1903 is depicted by one symbol, configured is a related-art charge pump that is capable of performing voltage step-up and voltage step-down operations in accordance with an input/output voltage.

The capacitor 1908 is coupled between an output terminal of the series regulator 1907 and the LVSS line.

Further, the switch 1913 and the capacitor 1910 are series-coupled between the common terminal a of the multiplexer 122 and an input terminal of the measurement circuit 131. Furthermore, the switch 1914 and the capacitor 1911 are series-coupled between the common terminal b of the multiplexer 122 and the input terminal of the measurement circuit 131.

The switches 1909, 1912 are parallel-coupled between the common terminal a of the multiplexer 122 and the common terminal b of the multiplexer 122.

The switch 1909 is coupled between a coupling line for the measurement circuit 131 and the capacitor 1910 and a coupling line for the measurement circuit 131 and the capacitor 1911. The switch 1912 is coupled between a coupling line for the capacitor 1910 and the switch 1913 and a coupling line for the capacitor 1911 and the switch 1914.

Figure 21:
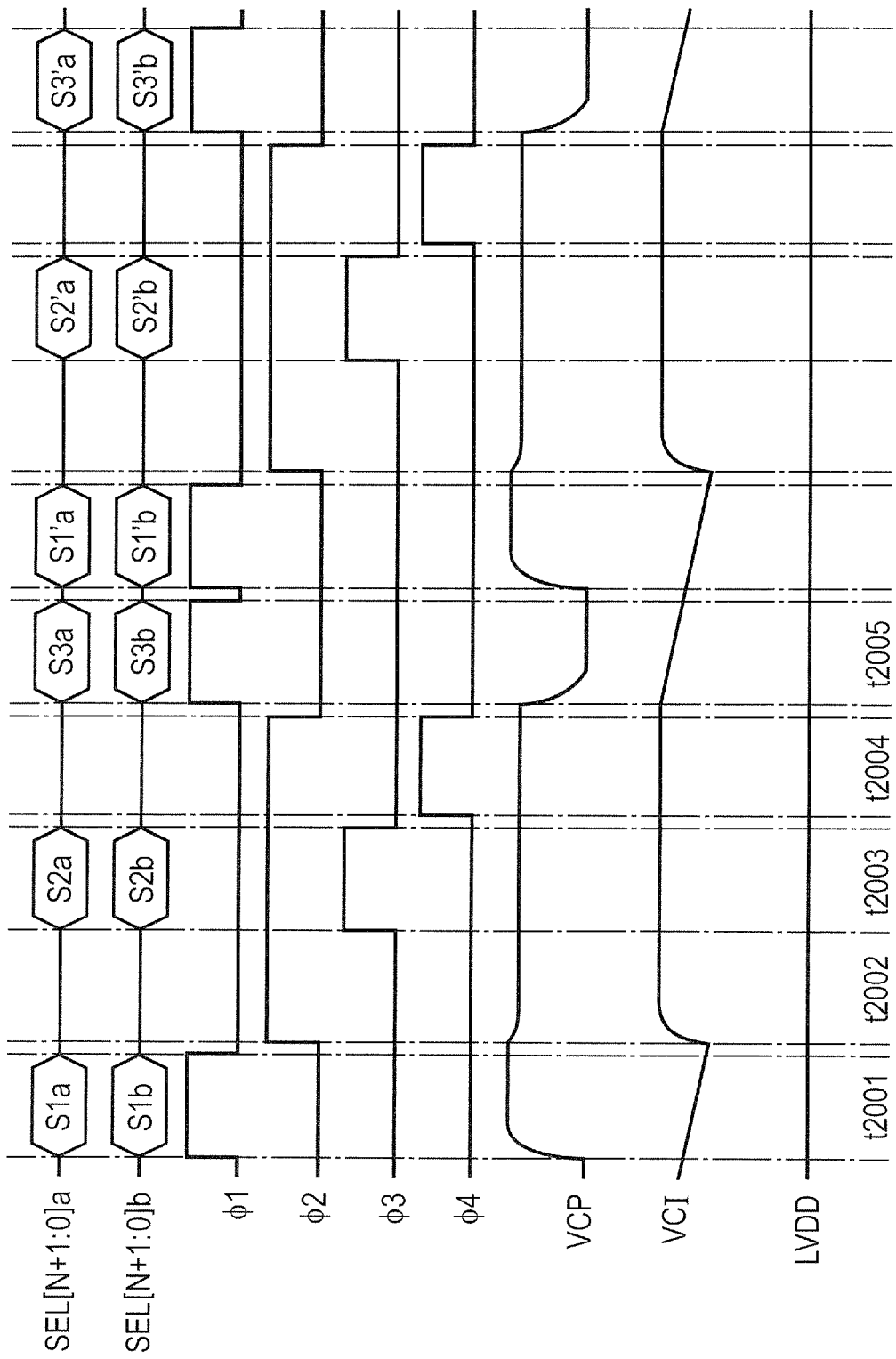
FIG. 21 is a timing diagram illustrating an exemplary operation of the semiconductor device according to the fourth embodiment.

FIG. 21 is a timing diagram illustrating an exemplary operation of the semiconductor device according to the fourth embodiment.

During a period t2001, the multiplexer 122 couples battery cells to the capacitor 1903 in switching patterns s1a and a1b. Switching patterns s1a and a1b are patterns of coupling battery cells that supply an electrical charge to the capacitor 1903 functioning as a charge pump CP. The switches 1901, 1902, which correspond to φ1, then close. This increases the voltage of the capacitor 1903 functioning as a charge pump CP, and decreases the voltage of the capacitor 1906.

During a period t2002, the switches 1901, 1902, which correspond to φ1, open, and the switches 1904, 1905, which correspond to φ2, close. As a result, the electrical charge stored in the capacitor 1903 is transferred to the capacitor 1906. This equalizes the voltages of the capacitor 1903 and the capacitor 1906.

During a period t2003, the multiplexer 122 couples battery cells to the low-voltage circuit in switching patterns s2a and a2b. Switching patterns s2a and a2b are patterns of coupling battery cells to be measured. The switches 1909, 1913, 1914, which correspond to φ3, then close. As a result, an electrical charge is stored in the capacitors 1910, 1911 to prepare for measurement.

During a period t2004, the switches 1909, 1913, 1914, which correspond to φ3, open, and the switch 1912, which corresponds to φ4, closes. The measurement circuit 131 measures the voltages of the capacitors 1910, 1911 in which an electrical charge is stored.

During a period t2005, the multiplexer 122 couples low-voltage battery cells to the capacitor 1903 in switching patterns s3a and a3b. If, in this instance, the voltage of the capacitor is higher than the voltages of battery cells selected in switching patterns s3a and a3b, the electrical charge of the capacitor charges the battery cells selected in switching patterns s3a and a3b.

Subsequently, the same operation as above is repeated.

As described above, the semiconductor device according to the fourth embodiment includes a charge pump that stores the electrical charges of battery cells and supplies electrical power from the battery cells to a power supply for the low-voltage circuit, and a sampling capacitor that stores the electrical charges of the battery cells, and uses the measurement circuit to measure the voltages of the battery cells from the electrical charge stored in the sampling capacitor. This makes it possible to use a common multiplexer for the measurement circuit and a circuit supplying electrical power to the power supply for the low-voltage circuit. This decreases the number of multiplexers.

Multiplexers are high-voltage resistant circuit parts. Therefore, the multiplexers are large-sized and expensive in order to let them handle high voltages and provide adequate insulation. Consequently, decreasing the number of multiplexers decreases their size and reduces their price.

It should be noted that a first charge pump and the sampling capacitor may store an electrical charge at different time points.

The semiconductor device 100, 800, 1200, 1900 may be implemented by hardware, such as an application-specific integrated circuit (ASIC), or software. Further, some processes may be performed by software and others may be performed by hardware. When a process is to be performed by software, a computer system having one or more central processing units (CPUs), such as microprocessors, may be allowed to execute programs related to functional block processing. These programs may be stored on various types of non-transitory computer-readable media and supplied to a computer. The non-transitory computer-readable media include various types of tangible storage media. Examples of the non-transitory computer-readable media include a magnetic recording medium (e.g., a flexible disk, a magnetic tape, or a hard disk drive), a magneto-optical recording medium (e.g., a magneto-optical disk), a CD-ROM (compact disc read-only memory), a CD-R, a CD-R/W, a DVD-ROM (digital versatile disc read-only memory), a DVD-R (DVD recordable), a DVD-R DL (DVD-R dual layer), a DVD-RW (DVD rewritable), a DVD-RAM, a DVD+R, a DVD+R DL, a DVD+RW, a BD-R (Blu-ray (registered trademark) disc recordable), a BD-RE (Blu-ray (registered trademark) disc rewritable), a BD-ROM, and a semiconductor memory (e.g., a mask ROM, a PROM (programmable ROM), an EPROM (erasable PROM), a flash ROM, or a RAM (random-access memory). Further, the programs may be supplied to the computer by using various types of transitory computer-readable media. Examples of the transitory computer-readable media include electrical signals, optical signals, and electromagnetic waves. The transitory computer-readable media are able to supply the programs to the computer through a wired communication channel, such as an electrical wire or an optical fiber, or through a wireless communication channel.

While the present invention contemplated by its inventors has been described in detail in terms of particular embodiments, the present invention is not limited to the foregoing embodiments. It will be obvious to those skilled in the art that various modifications can be made without departing from the spirit and scope of the present invention.

What is claimed is:

1. A semiconductor device comprising:
   a high-voltage resistant circuit that includes a multiplexer, the multiplexer selecting one of a plurality of series-coupled battery cells in a battery pack and coupling the selected battery cell to the battery pack; and
   a low-voltage circuit that includes a measurement circuit, the measurement circuit individually measuring each of the voltages of the battery cells;
   wherein upon determining that a minimum voltage of a respective battery cell is less than a minimum voltage of a power supply voltage range of the low-voltage circuit, the multiplexer couples only one of the battery cells to a power supply of the low-voltage circuit, and
   wherein upon determining that the minimum voltage of the respective battery cell is greater than or equal to the minimum voltage of the power supply voltage range of the low-voltage circuit, the multiplexer couples two of the battery cells to the power supply of the low-voltage circuit.

2. The semiconductor device according to claim 1,
   wherein the multiplexer couples one of the battery cells, except for a battery cell having the lowest measured voltage, to the power supply for the low-voltage circuit.

3. The semiconductor device according to claim 1,
   wherein the multiplexer includes a first multiplexer and a second multiplexer,
   wherein upon determining that the minimum voltage of the respective battery cell is greater than or equal to the minimum voltage of the power supply voltage range of the low-voltage circuit the first multiplexer couples one of the two battery cells to a positive power supply for the low-voltage circuit, the second multiplexer couples the other of the two battery cells to a negative power supply for the low-voltage circuit, and
   wherein the first multiplexer and the second multiplexer are independently couplable to different battery cells.

4. The semiconductor device according to claim 3,
   wherein the multiplexer includes a third multiplexer that selects one of the battery cells and couples the selected battery cell to the measurement circuit.

5. The semiconductor device according to claim 1, further comprising:
   a charge pump that stores electrical charges of the battery cells and supplies electrical power from the battery cells to a power supply for the low-voltage circuit.

6. The semiconductor device according to claim 5, further comprising:
   a capacitor that is capable of transferring an electrical charge of the charge pump;
   wherein electrical power is supplied to a power supply for the low-voltage circuit through the capacitor.

7. The semiconductor device according to claim 1, further comprising:
   a regulator that adjusts the voltage of a battery cell selected by the multiplexer to a power supply voltage of the low-voltage circuit.

8. The semiconductor device according to claim 1, further comprising:
   a charge pump that stores the electrical charges of the battery cells and supplies electrical power from the battery cells to a power supply for the low-voltage circuit; and
   a sampling capacitor that stores the electrical charges of the battery cells;
   wherein the measurement circuit measures the voltages of the battery cells from the electrical charges stored in the sampling capacitor.

9. The semiconductor device according to claim 8,
   wherein the charge pump and the sampling capacitor store electrical charges at different time points.

10. A battery system comprising:
    a battery pack that includes a plurality of series-coupled battery cells;
    a high-voltage resistant circuit that includes a multiplexer, the multiplexer selecting one of the battery cells in the battery pack and coupling the selected battery cell; and
    a low-voltage circuit that includes a measurement circuit, the measurement circuit individually measuring respective voltages of each battery cell through the multiplexer;
    wherein upon determining that a minimum voltage of a respective battery cell is less than a minimum voltage of a power supply voltage range of the low-voltage circuit, the multiplexer couples only one of the battery cells to a power supply of the low-voltage circuit, and
    wherein upon determining that the minimum voltage of the respective battery cell is greater than or equal to the minimum voltage of the power supply voltage range of the low-voltage circuit, the multiplexer couples two of the battery cells to the power supply of the low-voltage circuit.

11. The battery system according to claim 10,
    wherein the multiplexer couples one of the battery cells, except for a battery cell having the lowest measured voltage, to a power supply for the low-voltage circuit.

12. A battery control method comprising the steps of:
causing a measurement circuit to individually measure respective voltages of each of a plurality of series-coupled battery cells in a battery pack; and
upon determining that a minimum voltage of a respective battery cell is less than a minimum voltage of a power supply voltage range of a low-voltage circuit coupling only one of the battery cells to a power supply of the low-voltage circuit that includes the measurement circuit, and
wherein upon determining that the minimum voltage of the respective battery cell is greater than or equal to the minimum voltage of the power supply voltage range of the low-voltage circuit, coupling two of the battery cells to the power supply of the low-voltage circuit.

13. The battery control method according to claim 12, wherein one of the battery cells, except for a battery cell having the lowest measured voltage, is coupled to a power supply for the low-voltage circuit including the measurement circuit.

* * * * *